(12) United States Patent
Kim et al.

(10) Patent No.: US 12,717,436 B2
(45) **Date of Patent: *Aug. 25, 2026**

(54) TOUCH INPUT SENSING UNIT AND DISPLAY APPARATUS INCLUDING A NOTCH

(71) Applicant: Samsung Display Co., Ltd., Yongin-si (KR)

(72) Inventors: Kiwook Kim, Hwaseong-si (KR); Kwang-Min Kim, Seoul (KR); Yangwan Kim, Hwaseong-si (KR); Jisu Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/216,084

(22) Filed: May 22, 2025

(65) Prior Publication Data

US 2025/0284356 A1 Sep. 11, 2025

Related U.S. Application Data

(60) Division of application No. 18/648,279, filed on Apr. 26, 2024, now abandoned, which is a continuation of (Continued)

(30) Foreign Application Priority Data

Sep. 12, 2018 (KR) ........................ 10-2018-0109298
Oct. 26, 2018 (KR) ........................ 10-2018-0129178

(51) Int. Cl.
*G06F 3/041* (2006.01)
*H10K 59/131* (2023.01)
*H10K 59/40* (2023.01)

(52) U.S. Cl.
CPC ......... *G06F 3/0412* (2013.01); *H10K 59/131* (2023.02); *H10K 59/40* (2023.02); *G06F 2203/04112* (2013.01)

(58) Field of Classification Search
CPC ......... G06F 3/0412; G06F 2203/04112; H10K 59/131; H10K 59/40
See application file for complete search history.

(56) References Cited

U.S. PATENT DOCUMENTS 9,280,244 B2 3/2016 Lee et al.
9,618,782 B2 4/2017 Yao et al.

(Continued)

FOREIGN PATENT DOCUMENTS

CN 101833408 B 9/2010
CN 103294311 B 9/2013

(Continued)

OTHER PUBLICATIONS

Extended European Search Report dated Dec. 19, 2019, issued in EP Patent App. No. 19196265.3 (5 pages).

(Continued)

*Primary Examiner* — Nathan P Brittingham
(74) *Attorney, Agent, or Firm* — Womble Bond Dickinson (US) LLP

(57) ABSTRACT

An input sensing unit including a plurality of first electrodes, each of which including a plurality of first main patterns and a plurality of connection patterns disposed between the first main patterns to connect two first main patterns adjacent to each other, a plurality of second electrodes each of which including a plurality of second main patterns and a plurality of connection patterns disposed between the second main patterns to connect two second main patterns adjacent to each other, and a plurality of third electrodes receiving an electrical signal that is different from that received by the (Continued)

second electrode. Each of the third electrodes includes a plurality of third main patterns spaced apart from the second sensing patterns in a plan view and a plurality of third connection patterns disposed between the third main patterns to connect two third main patterns adjacent to each other and spaced apart from the first connection patterns in a plan view.

20 Claims, 28 Drawing Sheets

Related U.S. Application Data application No. 17/665,582, filed on Feb. 6, 2022, now Pat. No. 12,001,624, which is a continuation of application No. 16/556,340, filed on Aug. 30, 2019, now Pat. No. 11,243,624.

(56) References Cited

U.S. PATENT DOCUMENTS

| | | | | |
|---|---|---|---|---|
| 9,880,689 | B2 | 1/2018 | Lee et al. | |
| 10,353,501 | B2 | 7/2019 | Akimoto et al. | |
| 10,656,742 | B2 | 5/2020 | Kim et al. | |
| 2013/0257785 | A1 | 10/2013 | Brown et al. | |
| 2014/0002973 | A1 | 1/2014 | Lee et al. | |
| 2016/0282993 | A1 | 9/2016 | Song | |
| 2016/0349558 | A1 | 12/2016 | Shishido et al. | |
| 2017/0269763 | A1 | 9/2017 | Yang | |
| 2017/0308212 | A1* | 10/2017 | Jin | H10K 59/131 |
| 2018/0059869 | A1 | 3/2018 | Ma | |
| 2018/0088629 | A1 | 3/2018 | Kim | |
| 2018/0108710 | A1 | 4/2018 | Lin et al. | |
| 2018/0157359 | A1* | 6/2018 | Lin | H10D 86/423 |
| 2018/0224984 | A1* | 8/2018 | Kim | G06F 3/0443 |
| 2018/0348948 | A1 | 12/2018 | Lee et al. | |
| 2019/0265827 | A1 | 8/2019 | Liu et al. | |
| 2020/0012364 | A1* | 1/2020 | Ye | G06F 1/1637 |
| 2020/0026376 | A1 | 1/2020 | Lee et al. | |
| 2020/0042126 | A1* | 2/2020 | Feng | G06F 3/0416 |

FOREIGN PATENT DOCUMENTS

| | | | |
|---|---|---|---|
| CN | 105830004 | A | 8/2016 |
| CN | 108153445 | B | 6/2018 |
| CN | 108388366 | B | 8/2018 |
| KR | 10-2016-0140430 | A | 12/2016 |
| KR | 10-1758756 | B | 7/2017 |
| KR | 10-2018-0033355 | A | 4/2018 |
| KR | 10-2019-0117866 | A | 10/2019 |
| TW | 201806208 | A | 2/2018 |

OTHER PUBLICATIONS

Examination Report dated Nov. 11, 2020, issued in EP Patent App. No. 19196265.3 issued (8 pages).

* cited by examiner

FIG. 5A

TOUCH INPUT SENSING UNIT AND DISPLAY APPARATUS INCLUDING A NOTCH

CROSS-REFERENCE TO RELATED APPLICATION(S)

This application is a divisional of U.S. patent application Ser. No. 18/648,279, filed on Apr. 26, 2024, which is a continuation of U.S. patent application Ser. No. 17/665,582, filed on Feb. 6, 2022, issued as U.S. Pat. No. 12,001,624 on Jun. 4, 2024, which is a continuation of Ser. No. 16/556,340, filed on Aug. 30, 2019, issued as U.S. Pat. No. 11,243,624 on Feb. 8, 2022, which claims priority to and the benefit of Korean Patent Application Nos. 10-2018-0109298 and 10-2018-0129178, filed on Sep. 12, 2018 and Oct. 26, 2018, respectively, all of which are hereby incorporated by reference for all purposes as if fully set forth herein.

BACKGROUND

Field

Exemplary embodiments of the invention relate generally to an input sensing unit and a display apparatus including the same, and more specifically, to an input sensing unit having improved electrical reliability and a display apparatus including the same.

Discussion of the Background

Various electronic devices used in multimedia devices, such as televisions, mobile phones, table computers, navigation devices, and game consoles, are being developed. Such electronic devices may include a keyboard or a mouse as an input unit. The electronic devices may also include a display apparatus. Such a display apparatus includes a display unit as an output device and an input sensing unit as an input device.

The above information disclosed in this Background section is only for understanding of the background of the inventive concepts, and, therefore, it may contain information that does not constitute prior art.

SUMMARY

Exemplary embodiments of the present invention provide an input sensing unit having improved external input sensitivity and a display apparatus including the same.

Additional features of the inventive concepts will be set forth in the description which follows, and in part will be apparent from the description, or may be learned by practice of the inventive concepts.

An exemplary embodiment of the inventive concept provides an input sensing unit including: a plurality of first electrodes arranged in a first direction and each of which extends in a second direction crossing the first direction and includes a plurality of first main patterns arranged in the second direction and a plurality of connection patterns disposed between the first main patterns to connect two first main patterns adjacent to each other; a plurality of second electrodes arranged in the second direction and each of which extends in the first direction and includes a plurality of second main patterns arranged in the first direction and a plurality of connection patterns disposed between the second main patterns to connect two second main patterns adjacent to each other; and a plurality of third electrodes arranged in the second direction, each of which extends in the first direction, and which receive an electrical signal that is different from that received by the second electrode. Each of the third electrodes includes: a plurality of third main patterns arranged in the first direction and spaced apart from the second sensing patterns in a plan view; and a plurality of connection patterns disposed between the third main patterns to connect two third main patterns adjacent to each other and spaced apart from the first connection patterns in a plan view.

The first connection patterns and the second connection patterns may be disposed on layers different from each other.

The third connection patterns and the first connection patterns may be disposed on the same layer.

The second main patterns and the third main patterns may be disposed on the same layer and spaced apart from each other in a plan view.

An opening may be defined in each of the second main patterns, and the third main patterns may be disposed in the openings, respectively.

The third connection patterns and the first main patterns may be disposed on layers different from each other.

Each of the third connection patterns may overlap at least a portion of the first electrodes in a plan view.

Each of the third main patterns may include: a central part; and a branch part connected to one side of the central part and protruding from the central part in the first direction, wherein each of the third connection patterns may be connected to the branch part.

The branch part may be provided in plurality to be respectively disposed on both sides of the central part.

The branch part may have a bar shape extending in the first direction.

The branch part may have a zigzag shape extending in the first direction.

The second connection patterns and the third connection patterns may have shapes different from each other.

Each of the third connection patterns may include a plurality of sub connection patterns arranged in the second direction and connected to the same third main pattern.

Each of the first connection patterns may be connected to each of the first main patterns to provide a single body.

Each of the first to third main patterns may include a plurality of mesh lines.

Each of the third connection patterns may extend along the mesh lines.

The first connection patterns and the third main patterns may not overlap each other.

The third connection patterns may overlap the first electrode and the second electrode in a plan view.

Each of the third electrodes may receive a ground voltage.

Another exemplary embodiment of the inventive concept provides a display apparatus including: a display unit including a plurality of pixels configured to display an image; and an input sensing unit disposed to overlap the pixels and including a first electrode, a second electrode, and a third electrode, which receive electrical signals different from each other, each of the first electrode, the second electrode, and the third electrode including: a plurality of main patterns arranged to be spaced apart from each other; and a plurality of connection patterns disposed between the main patterns to connect two main patterns adjacent to each other. The connection patterns of the third electrode and the connection patterns of the first electrode are spaced apart from each other in a plan view.

The connection patterns of the first electrode and the connection patterns of the third electrode may be disposed on the same layer.

The connection patterns of the first electrode and the main patterns of the first electrode may be disposed on layers different from each other, and the connection patterns of the third electrode and the main patterns of the third electrode may be disposed on layers different from each other.

The main patterns of the third electrode may be spaced apart from the main patterns of the first electrode in a plan view.

The connection patterns of the first electrode and the connection patterns of the second electrode may be disposed on layers different from each other.

The connection patterns of the first electrode and the connection patterns of the third electrode may overlap the main patterns of the first electrode in a plan view.

The main patterns of the second electrode and the main patterns of the third electrode may be arranged in the same direction.

A predetermined opening may be defined in each of the main patterns of the second electrode, and the main patterns of the third electrode may be disposed in the openings, respectively.

Each of the main patterns may include a plurality of mesh lines.

Each of the connection patterns of the third electrode may extend along the mesh lines.

Each of the pixels may include an organic light emitting element or a quantum dot light emitting element.

The third electrode may receive a ground voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 5A is an enlarged cross-sectional view of the display unit according to an exemplary embodiment of the inventive concept.

DETAILED DESCRIPTION

Figure 1:
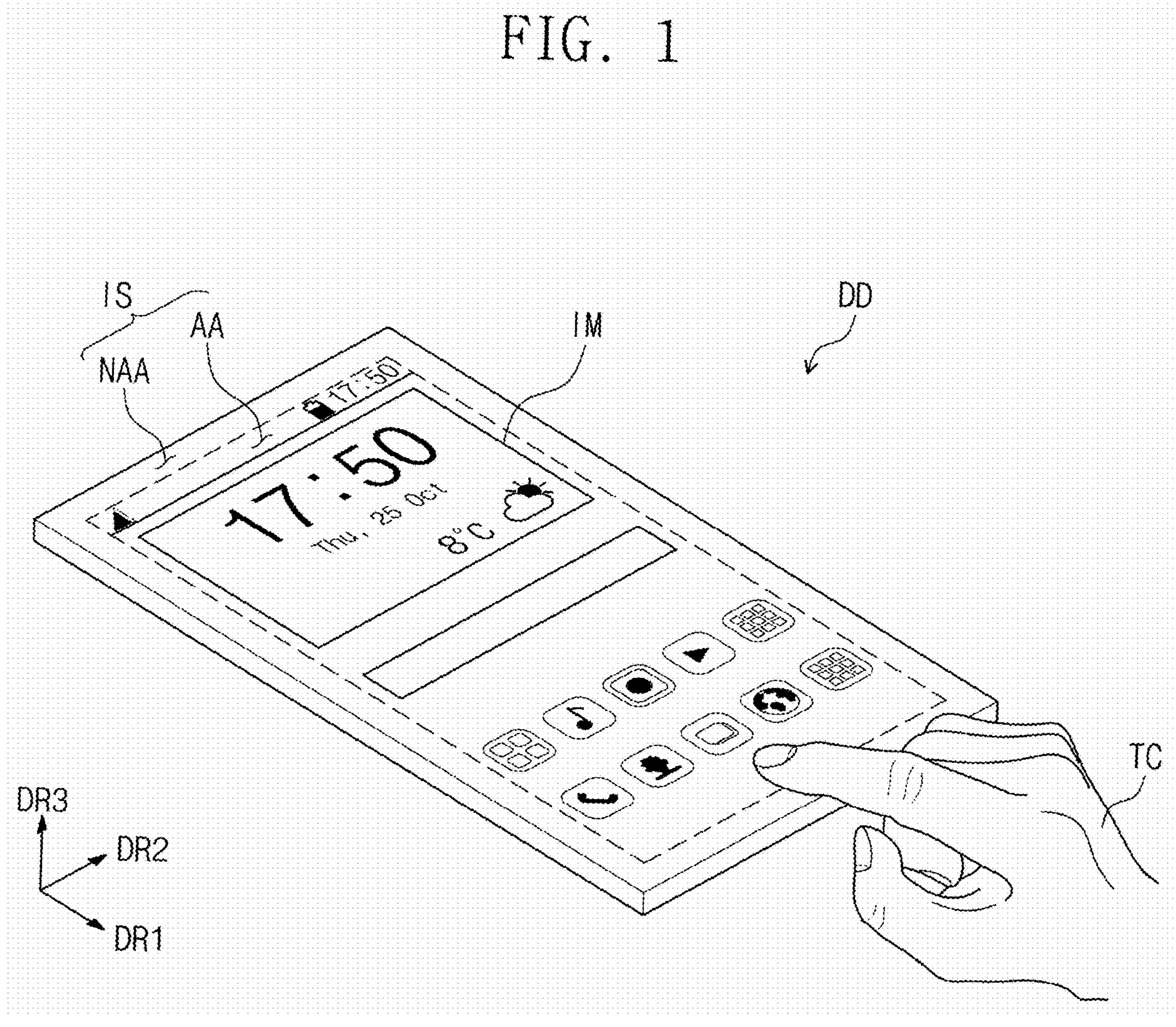
FIG. 1 is a perspective view of a display apparatus according to an exemplary embodiment of the inventive concept.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display apparatus according to an embodiment of the inventive concept. Referring to FIG. 1, a display apparatus DD may display an image IM through a front surface IS. The front surface IS is parallel to a surface defined by a first directional axis DR1 and a second directional axis DR2.

A normal direction of the front surface IS, i.e., a thickness direction of the display apparatus DD is indicated as a third directional axis DR3. A front surface (or a top surface) and a rear surface (or a bottom surface) of each of members or units, which will be described below, are distinguished by the third directional axis DR3. However, the first to third directional axes illustrated in this exemplary embodiment are only examples. Hereinafter, first to third directions may be directions indicated by the first to third directional axes DR1, DR2, and DR3 and designated by the same reference numerals, respectively.

Although the display apparatus DD having a planar front surface is illustrated in an exemplary embodiment of the inventive concept, the inventive concept is not limited thereto. The display apparatus DD may include a curved front surface or a solid front surface. The solid front surface may include a plurality of display areas that indicate different directions. For example, the solid front surface may include a polygonal column-type front surface.

The display apparatus DD according to the current exemplary embodiment may be a rigid display apparatus. However, the inventive concept is not limited thereto. For example, the display apparatus DD according to the inventive concept may be a flexible display apparatus DD. According to this exemplary embodiment, the display apparatus DD that is capable of being applied to a mobile terminal is exemplarily illustrated.

Although not shown in FIG. 1, electronic modules, a camera module, a power module, and the like, which are mounted on a main board, may be disposed on a bracket/ case together with the display apparatus DD to constitute the mobile terminal. The display apparatus DD according to the inventive concept may be applied to large-sized electronic devices such as televisions and monitors and small and middle-sized electronic devices such as tablet PC, navigation units for vehicles, game consoles, and smart watches.

Referring to FIG. 1, the front surface IS of the display apparatus DD includes an active area AA and a peripheral area NAA adjacent to the active area AA. In this exemplary embodiment, the active area AA may be an area on which the image IM is displayed, and also, the external input TC is sensed.

The image IM includes a still image and a dynamic image. FIG. 1 illustrates icon images as an example of the image IM.

The external input TC includes a user's input TC applied from the outside. The user's input TC includes various types of external inputs, such as a portion of user's body, light, heat, a pressure, or the like. In this exemplary embodiment, the user's input TC is illustrated as a user's hand applied to the front surface.

However, this is merely an example. For example, the display apparatus DD may sense the user's input TC applied to a side surface or rear surface of the display apparatus DD. Here, the active area AA may be expanded up to the side surface or rear surface of the display apparatus DD. The display apparatus DD according to the inventive concept may be designed to have various shapes, but is not limited to a specific embodiment.

The peripheral area NAA is an area on which the image IM is not displayed, or the external input is not sensed even though an electrical signal is applied. As illustrated in FIG. 1, the active area AA may have a rectangular shape. The peripheral area NAA may surround the active area AA. However, the inventive concept is not limited thereto. For example, the active area AA and the peripheral area NAA may be designed differently relative to each other.

FIGS. 2A to 2D are cross-sectional views of the display apparatus according to an exemplary embodiment of the inventive concept. FIGS. 2A to 2D illustrate cross-sections defined by the second directional axis DR2 and the third directional axis DR3. FIGS. 2A to 2D are simply illustrated to explain a lamination relationship of functional panels and/or functional units constituting the display apparatus DD.

The display apparatus DD according to an exemplary embodiment of the inventive concept may include a display unit, an input sensing unit, an anti-reflection unit, and a widow. At least portions of the display panel, the input sensing sensor, the anti-reflection unit, and the window may be formed through a continuous process, and at least portions may be coupled to each other through an adhesion member. FIGS. 2A to 2D illustrate an optically clear adhesive (OCA) as an example of the adhesion member. Hereinafter, the adhesion member may include a general adhesive or adhesive agent. In the inventive concept, the anti-reflection unit and the window may be replaced with different constituents or omitted entirely.

In FIGS. 2A to 2D, a corresponding constituent of the input sensing sensor, the anti-reflection unit, and the window, which is formed with respect to the other constituent through the continuous process, may be expressed as a "layer." A constituent of the input sensing unit, the anti-reflection unit, and the window, which is coupled to the other constituent through the adhesion member, may be expressed as a "panel." The "panel" may include a base layer providing a base surface, for example, a synthetic film, a complex material film, a glass substrate, and the like, but the base layer may be omitted in the "layer". That is to say, the units expressed as the "layer" may be disposed on the base surface provided by the other unit.

The display unit, the input sensing unit, the anti-reflection unit, and the window may be referred to as a display panel DP, an input sensing panel ISP, an anti-reflection panel RPP, and a window panel WP or a display panel DP, an input sensing layer ISL, an anti-reflection layer RPL, and a window layer WL.

Figure 2A:
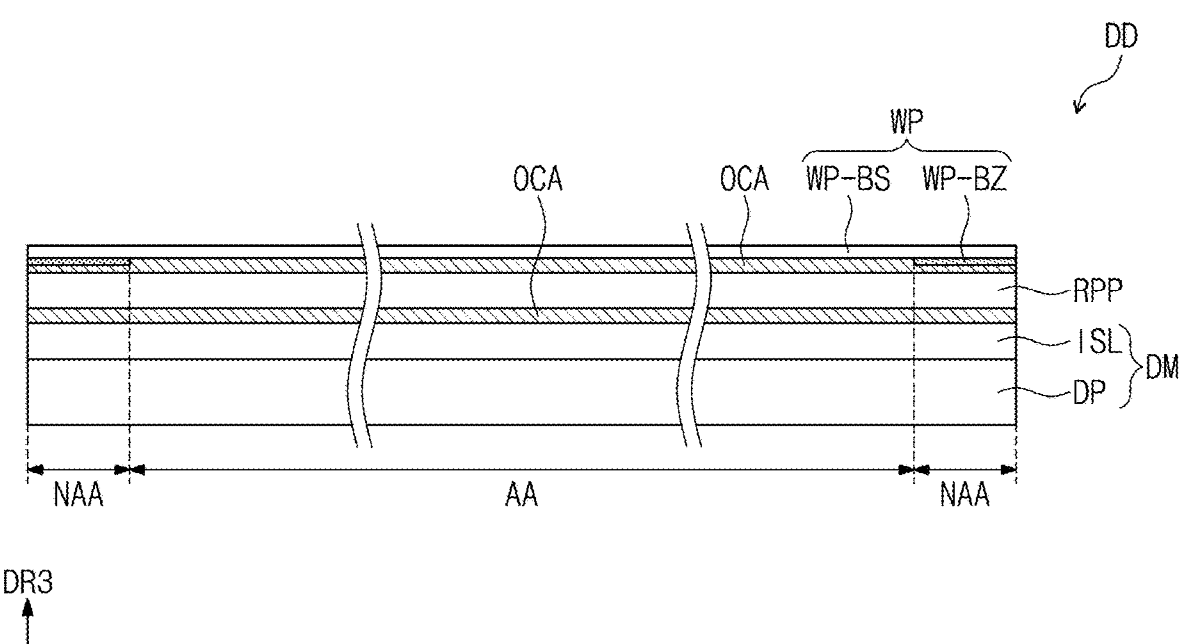
FIGS. 2A, 2B, 2C, and 2D are cross-sectional views of the display apparatus according to an exemplary embodiment of the inventive concept.

As illustrated in FIG. 2A, the display apparatus DD may include a display panel DP, an input sensing layer ISL, an anti-reflection panel RPP, and a window panel WP. The input sensing layer ISL is directly disposed on the display panel DP. In this disclosure, "a constituent B is directly disposed on a constituent A" may mean that a separate adhesive layer/adhesive member is not disposed between the constituents A and B. The constituent B may be formed through the continuous process on the base surface provided by the constituent A after the constituent A is formed.

The display panel DP and the input sensing layer ISL directly disposed on the display panel DP may be defined as a display module DM. An optically clear adhesive (OCA) is disposed between the display module DM and the anti-reflection panel RPP and between the anti-reflection panel RPP and the window panel WP.

The display panel DP generates an image, and the input sensing layer ISL acquires coordinate information of an external input (for example, a touch event). Although not separately shown, the display module DM according to the inventive concept may further include a protection member disposed on a bottom surface of the display panel DP. The protection member and the display panel DP may be coupled to each other through an adhesion member. The display apparatus DD of FIGS. 2B to 2D, which will be described below, may also further include the protection member.

The display panel DP according to an exemplary embodiment of the inventive concept may be an emission type display panel, but is not limited thereto. For example, the display panel DP may be an organic light emitting display panel or a quantum dot light emitting display panel. The organic light emitting display panel may include an organic light emitting material. A light emitting layer of the quantum dot light emitting display panel may include a quantum dot light emitting element, such as a quantum dot, a quantum rod, and the like. Hereinafter, the display panel DP may be described as the organic light emitting display panel.

The anti-reflection panel RPP reduces reflectance of external light incident from an upper side of the window panel WP. The anti-reflection panel RPP according to an exemplary embodiment of the inventive concept may include a retarder and a polarizer. The retarder may be a film type or liquid crystal coating type retarder, and may include a $\lambda/2$ retarder and/or a $\lambda/4$ retarder. The polarizer may also be a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The retarder and polarizer itself or the protection film may be defined as a base layer of the anti-reflection panel RPP.

The anti-reflection panel RPP according to an exemplary embodiment of the inventive concept may include color filters. The color filters may have predetermined arrangement. The color filters may be determined in arrangement in consideration of colors of light emitted from pixels provided in the display panel DP. The anti-reflection panel RPP may further include a black matrix adjacent to the color filters.

The anti-reflection panel RPP according to an exemplary embodiment of the inventive concept may include a destructive interference structure. For example, the destructive interference structure include first reflection layer and a second reflection layer, which are disposed on layers different from each other. First reflected light and second reflected light, which are respectively reflected from the first reflection layer and the second reflection layer, may destructively interfere, and thus, reflectance of the external light may be reduced.

The window panel WP according to an exemplary embodiment of the inventive concept includes a base layer WP-BS and a light blocking pattern WP-BZ. The base layer WP-BS may include a glass substrate and/or a synthetic film. The base layer WP-BS is not limited to a single layer. The base layer WP-BS may include two or more films that are coupled to each other through the adhesion member.

The light blocking pattern WP-BZ partially overlaps the base layer WP-BS. The light blocking pattern WP-BZ is disposed on a rear surface of the base layer WP-BS, particularly, corresponding to the peripheral area NAA of the display apparatus DD. An area on which the light blocking pattern WP-BZ is not disposed may be corresponding to the active area AA of the display apparatus DD.

The light blocking pattern WP-BZ may be a colored organic film, for example, which is formed in a coating manner. Although not shown, the window panel WP may further include a functional coating layer disposed on an entire surface of the base layer WP-BS. The functional coating layer may include an anti-fingerprint layer, an anti-reflection layer, a hard coating layer, and the like. Hereinafter, referring to FIGS. 2B to 2D, the window panel WP and the window layer WL will be simply illustrated without distinguishing the base layer WP-BS and the light blocking pattern WP-BZ from each other.

Figure 2B:
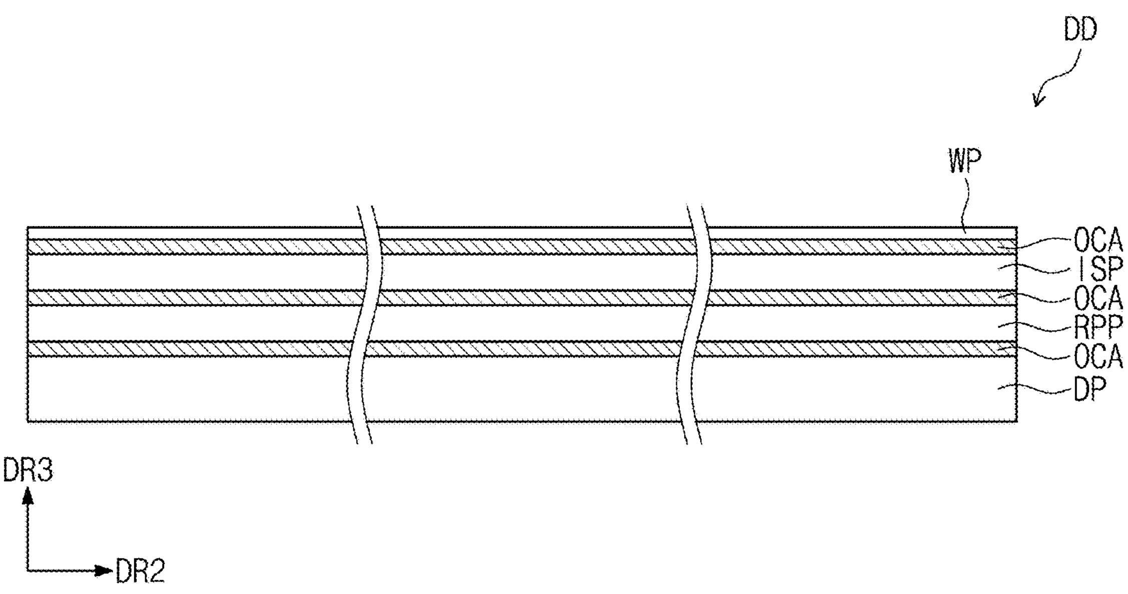
Figure 2C:
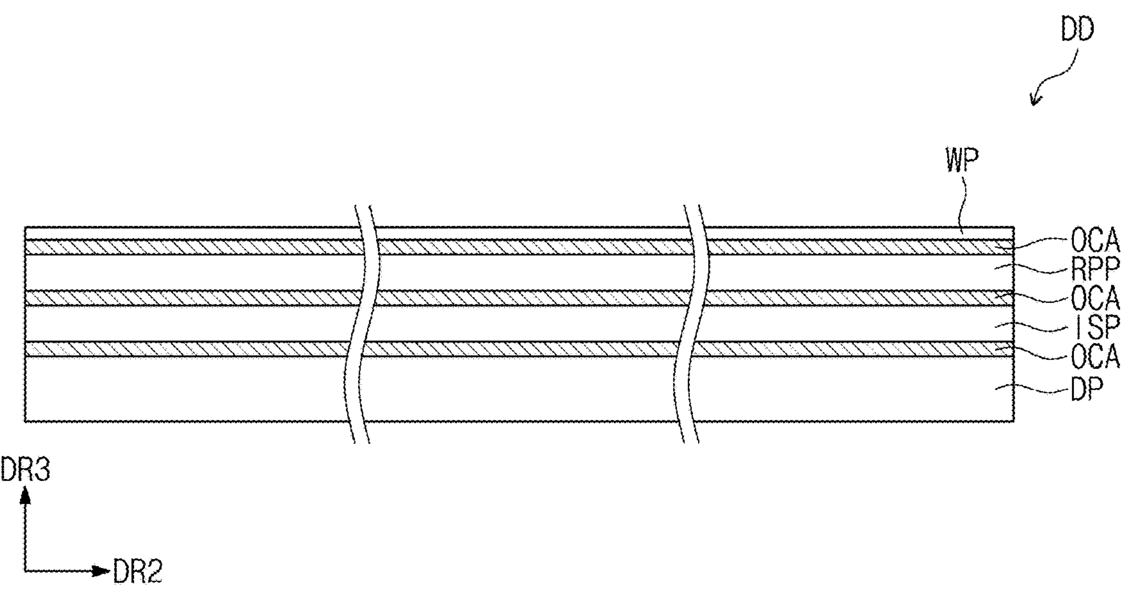

As illustrated in FIGS. 2B and 2C, the display apparatus DD may include the display panel DP, the input sensing panel ISP, the anti-reflection panel RPP, and the window panel WP. A laminated order of the input sensing panel ISP and the anti-reflection panel RPP may be changed.

Figure 2D:
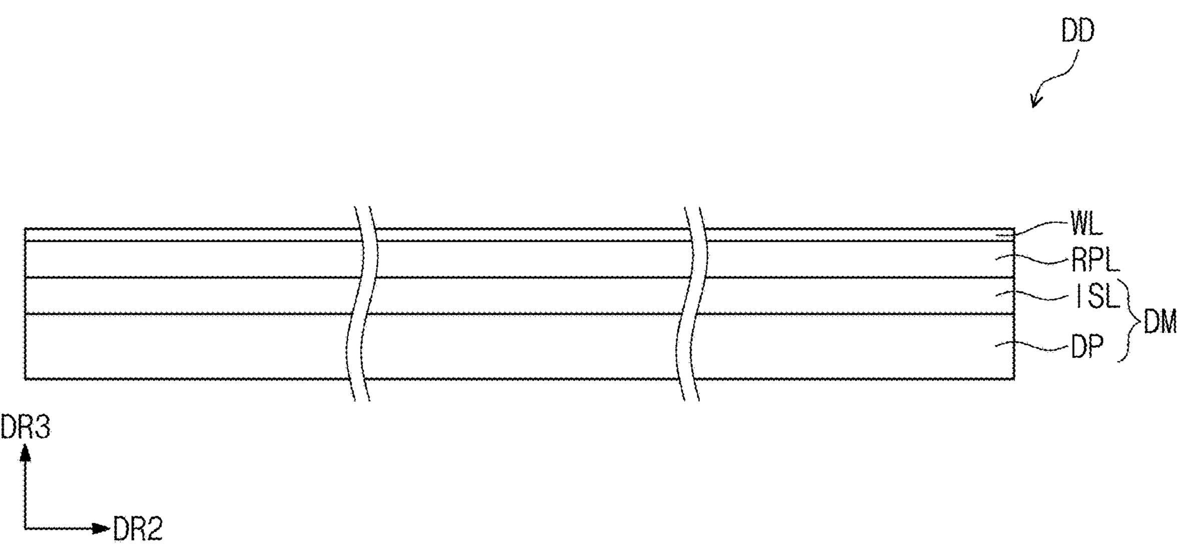

As illustrated in FIG. 2D, the display apparatus DD may include the display panel DP, the input sensing layer ISL, the anti-reflection layer RPL, and the window layer WL. The adhesion members may be omitted from the display apparatus DD, and the input sensing layer ISL, the anti-reflection layer RPL, and the window layer WL may be formed on the base surface provided on the display panel DP through the continuous process. A laminated order of the input sensing layer ISL and the anti-reflection panel RPP may be changed.

Figure 3A:
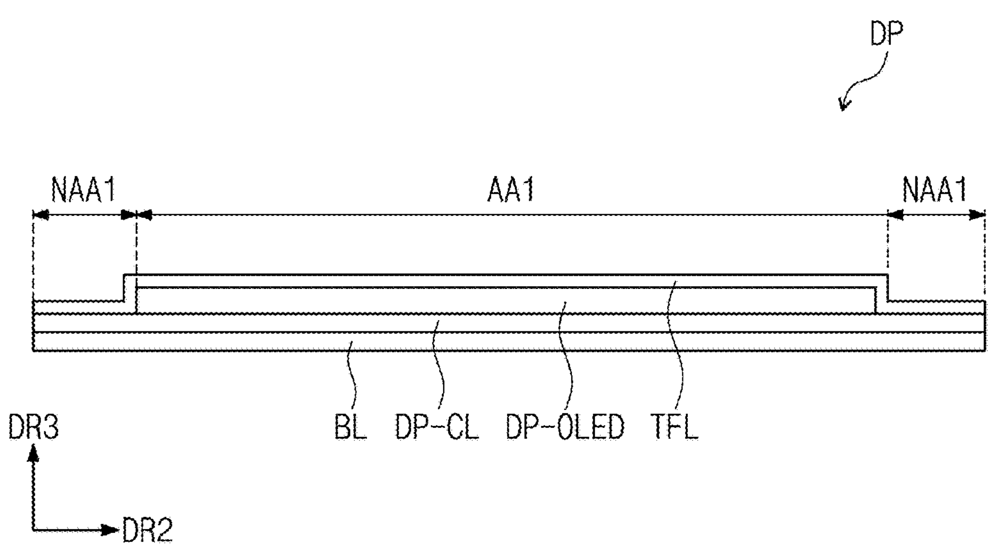
FIGS. 3A and 3B are cross-sectional views of a display panel according to an exemplary embodiment of the inventive concept.
Figure 3B:
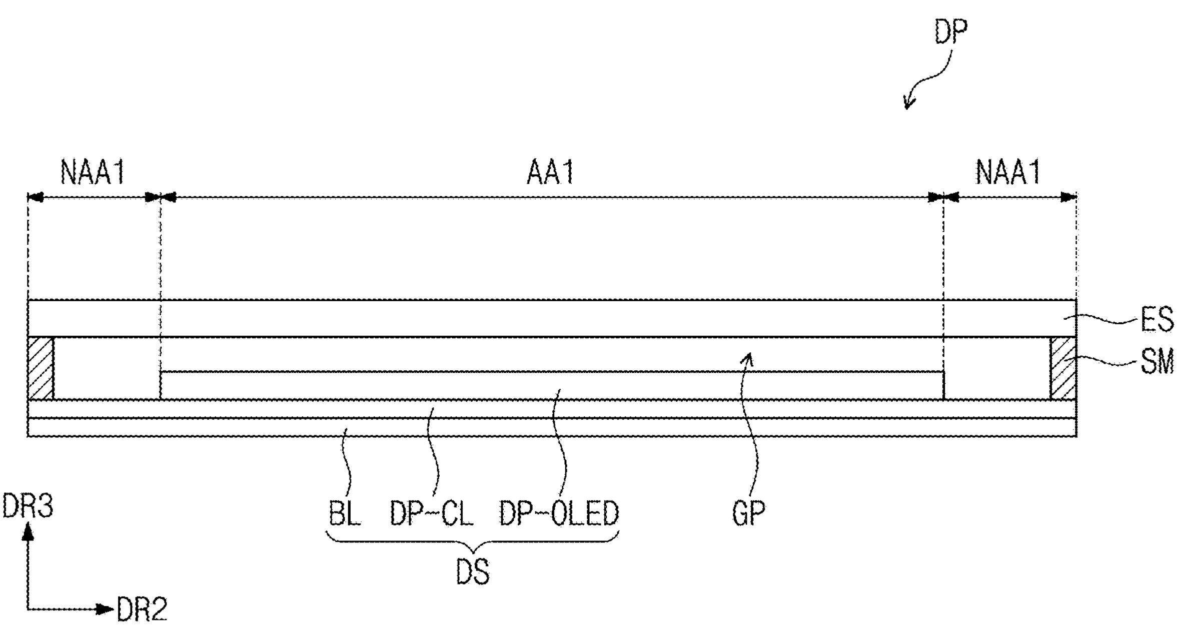

FIGS. 3A and 3B are cross-sectional views illustrating a portion of the display apparatus DD according to an exemplary embodiment of the inventive concept. The display panel DP may correspond to a display unit that will be described later. In this exemplary embodiment, "an area corresponds to an area" may mean that the areas overlap each other and have the same surface area, but the description is not limited thereto. This will be described later in detail.

As illustrated in FIG. 3A, the display panel DP may include a base layer BL, a circuit element layer DP-CL disposed on the base layer BL, a display element layer DP-OLED, and an upper insulation layer TFL.

A display area AA1 and a non-display area NAA1 may be defined on the display panel DP. The display area AA1 may be an area on which the image IM is displayed, and the non-display area NAA1 may be on area on which the image IM is not displayed. The display area AA1 and the non-display area NAA1 may be provided to correspond to the active area AA and the peripheral area NAA of FIG. 1. In this exemplary embodiment, "an area corresponds to an area" may mean that the areas overlap each other and have the same surface area, but is not limited thereto.

The base layer BL may include at least one plastic film. The base layer BL may include a plastic substrate, a glass substrate, a metal substrate, and an organic/inorganic composite substrate.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of the pixel, and the like. This will be described later in detail.

The display element layer DP-OLED may include organic light emitting diodes. The display element layer DP-OLED may further include an organic film, such as a pixel defining layer.

The upper insulation layer TFL may include a plurality of thin films. One portion of the thin films may be disposed to improve optical efficiency, and the other portion of the thin films may be disposed to protect the organic light emitting diodes. The upper insulation layer TFL will be described later in detail.

As illustrated in FIG. 3B, the display panel DP may include a base layer BL, a circuit element layer DP-CL disposed on the base layer BL, a display element layer DP-OLED, an encapsulation layer ES, and a sealant SM coupling the base layer BL to the encapsulation layer ES. The encapsulation layer ES may be spaced a predetermined gap GP from the display element layer DP-OLED. Each of the base layer BL and the encapsulation layer ES may include a plastic substrate, a glass substrate, a metal substrate, and an organic/inorganic composite substrate. The sealant SM may include an organic adhesion member or frit.

Figure 4:
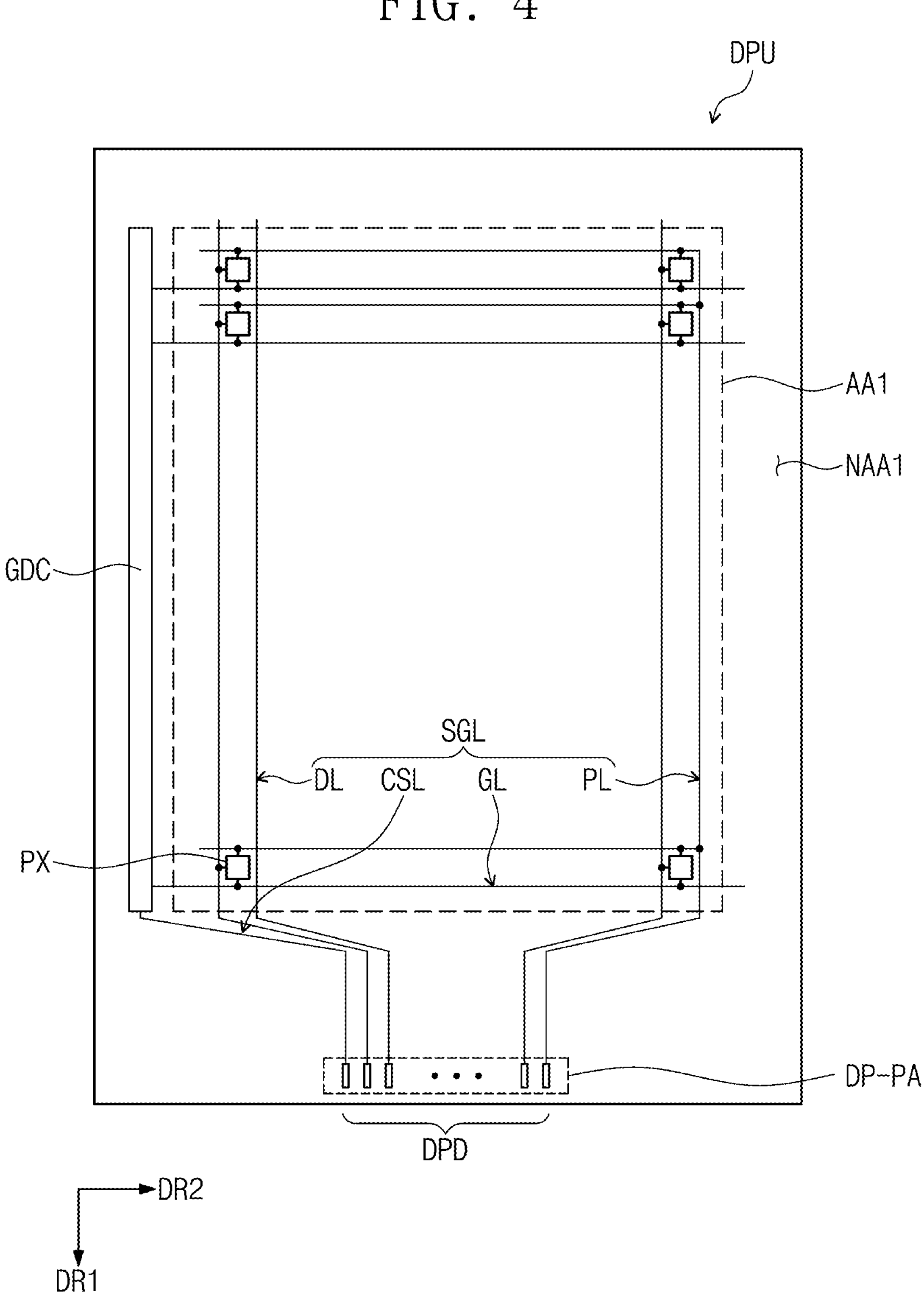
FIG. 4 is a plan view of a display unit according to an exemplary embodiment of the inventive concept.
Figure 5A:
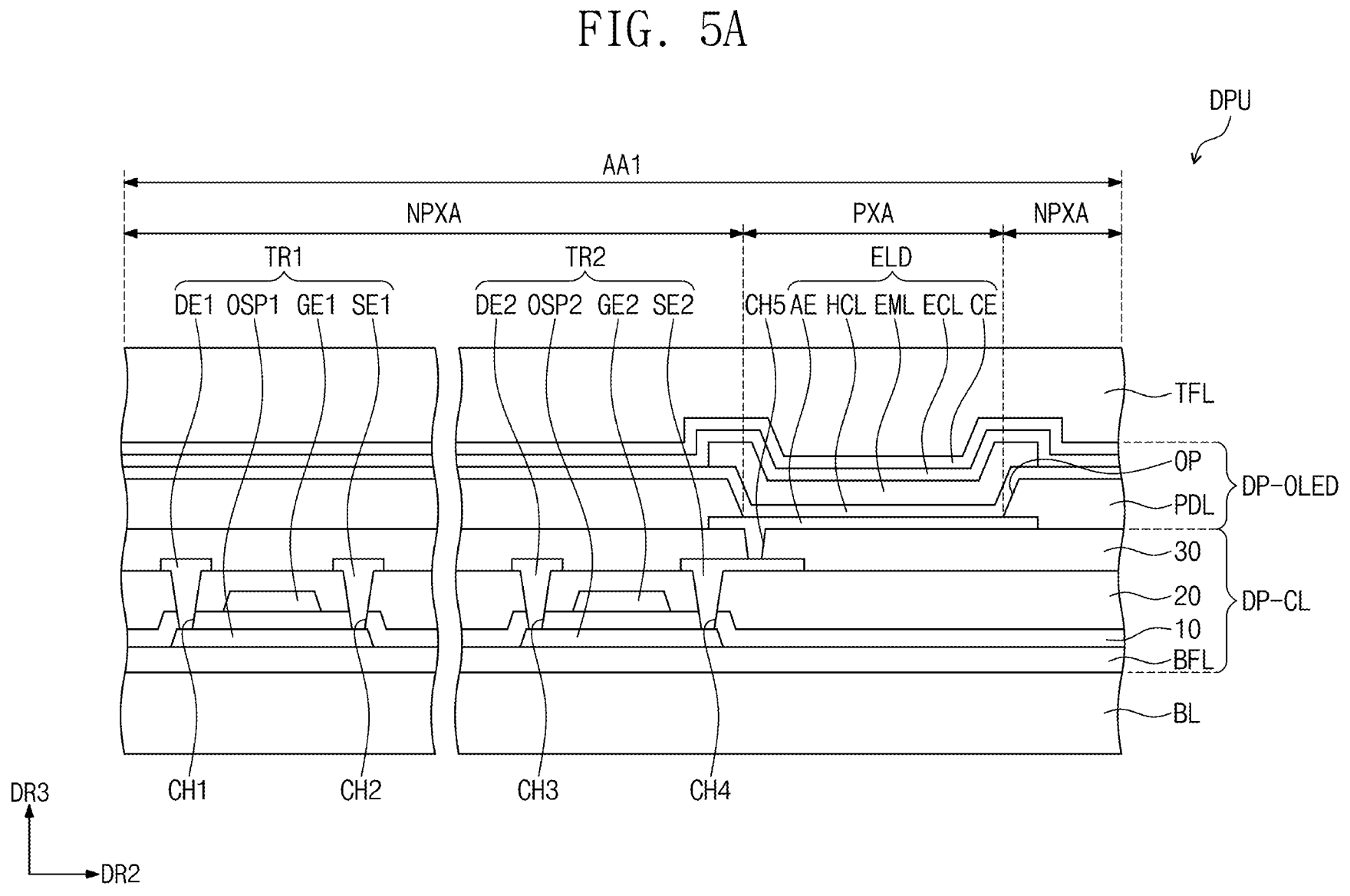
Figure 5B:
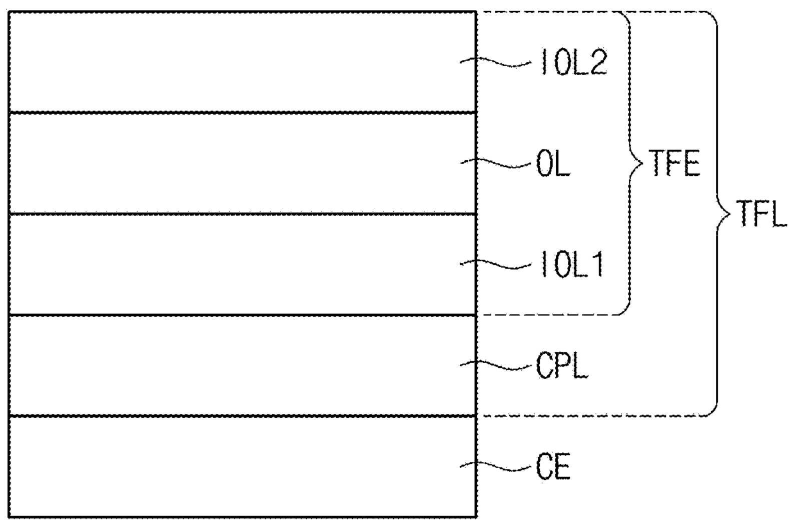
FIG. 5B is an enlarged cross-sectional view of an upper insulation layer according to an exemplary embodiment of the inventive concept.

FIG. 4 is a plan view of a display unit according to an embodiment of the inventive concept. FIG. 5A is an enlarged cross-sectional view of the display unit according to an embodiment of the inventive concept. FIG. 5B is an enlarged cross-sectional view of an upper insulation layer according to an embodiment of the inventive concept. The display unit DPU of FIGS. 4 and 5A will be described based on the display panel DP of FIG. 3A.

As illustrated in FIG. 4, the display unit DPU may include a driving circuit GDC, a plurality of signal lines SGL (hereinafter, referred to as signal lines), a plurality of signal pads DPD (hereinafter, referred to as signal pads), and a plurality of pixels PX (hereinafter, referred to as pixels).

The display area AA1 may be defined as an area on which the pixels PX are disposed. Each of the pixels PX includes an organic light emitting diode and a pixel driving circuit connected to the organic light emitting diode. The circuit element layer DP-CL of FIGS. 3A and 3B may include the driving circuit GDC, the signal lines SGL, the signal pads DPD, and a pixel driving circuit.

The driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described later. The scan driving circuit may further output other control signals to the driving circuit of each of the pixels PX.

The scan driving unit may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL includes scan lines GL, data lines DL, a power line PL, and a control signal line CSL. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

The signal lines SGL overlaps the display area AA1 and the non-display area NAA1. The signal lines SGL may include a pad part and a line part. The line part overlaps the display area AA1 and the non-display area NAA1. The pad part is connected to an end of the line part. The pad part is disposed on the non-display area NAA1 to overlap a corresponding signal pad of the signal pads DPD. An area of the non-display area NAA1, on which the signal pads DPD are disposed, may be defined as a pad area DP-PA. The pad area DP-PA may be connected to a circuit board (not shown).

Substantially, the line part connected to the pixel PX may constitute most of the signal lines SGL. The line part is connected to the transistors TR1 and TR2 (see FIG. 5A) of the pixel PX. The line part may have a single/multilayered structure. The line part may be a single body or include two or more portions. The two or more portions may be disposed on layers different from each other and connected to each other a contact hole passing through the insulation layer disposed between the two portions.

FIG. 5A illustrates a partial cross-section of the display panel DP corresponding to the transistors TR1 and TR2 and the light emitting element ELD. The circuit element layer DP-CL disposed on the base layer BL includes at least one insulation layer and a circuit element. The circuit element includes the signal line and the driving circuit of the pixel. The circuit element layer DP-CL may be formed through a process of forming an insulation layer, a semiconductor layer, and a conductive layer by coating or deposition and a process of patterning the insulation, the semiconductor layer, and the conductive layer by a photolithography process.

In this exemplary embodiment, the circuit element layer DP-CL may include a buffer layer BFL, a first intermediate inorganic layer 10, and a second intermediate inorganic layer 20, which are inorganic layers, and an intermediate organic layer 30 that is an organic layer. The buffer layer BFL may include a plurality of inorganic layers. FIG. 5A illustrates an example of an arrangement relationship between a first semiconductor pattern OSP1, a second semiconductor pattern OSP2, a first control electrode GE1, a second control electrode GE2, a first input electrode DE1, a second output electrode SE1, a second input electrode DE2, and a second output electrode SE2, which constitute the switching transistor TR1 and the driving transistor TR2. First to fourth through-holes CH1 to CH4 are illustrated exemplarily.

The display element layer DP-OLED may include a light emitting element ELD. In this exemplary embodiment, the light emitting element ELD is provided as an example of the organic light emitting element. However, this is merely an example. For example, the light emitting element ELD may include various examples, such as electrophoretic devices, electro-wetting devices, liquid crystal capacitors, quantum dot diodes, nano-LEDs, micro-LEDs, and the like.

The display element layer DP-OLED includes a pixel defining layer PDL. The pixel defining layer PDL includes an insulation material. For example, the pixel defining layer PDL may be an organic layer.

A first electrode AE of the light emitting element ELD is disposed on the intermediate organic layer 30. The first electrode AE of the light emitting element ELD is connected to the second output electrode SE2 through the fifth through-hole CH5 passing through the intermediate organic layer 30. An opening OP is defined in the pixel defining layer PDL. The opening OP of the pixel defining layer PDL exposes at least a portion of the first electrode AE of the light emitting element ELD. The opening OP of the pixel defining layer PDL is called as a light emitting opening to be distinguished from other openings.

As illustrated in FIG. 5A, the display area AA1 may include an emission area PXA and a non-emission area NPXA adjacent to the emission area PXA. The non-emission area NPXA may surround the emission area PXA. In the current exemplary embodiment, the emission area PXA may be defined to correspond to a portion of the first electrode AE of the light emitting element ELD exposed by the light emitting opening OP.

A hole control layer HCL may be commonly disposed on the emission area PXA and the non-emission area NPXA. The hole control layer HCL may include a hole transport layer and may further include a hole injection layer. The emission layer EML is disposed on the hole control layer HCL. The emission layer EML may be disposed on an area corresponding to the light emitting opening OP. That is, the emission layer EML may be formed to be separated from each of the pixels PX. Also, the emission layer EML may include an organic material and/or an inorganic material. The emission layer EML may generate light having a predetermined color.

An electron control layer ECL is disposed on the emission layer EML. The electron control layer ECL may include an electron transport layer and may further include an electron injection layer. The hole control layer HCL and the electron control layer ECL may be formed commonly formed on the plurality of pixels by using an open mask. A second electrode CE of the light emitting element ELD is disposed on the electron control layer ECL. The second electrode CE of the light emitting element ELD is provided as a single body and commonly disposed on the plurality of pixels.

As illustrated in FIGS. 5A and 5B, the upper insulation layer TFL is disposed on the second electrode CE of the light emitting element ELD. The upper insulation layer TFL may include a plurality of thin films. According to this exemplary embodiment, the upper insulation layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL is disposed on the second electrode CE of the light emitting element ELD to contact the second electrode CE of the light emitting element ELD. The capping layer CPL may include an organic material. The first inorganic layer IOL1 is disposed on the capping layer CPL to contact the capping layer CPL. The organic layer OL is disposed on the first inorganic layer IOL1 to contact the first inorganic layer IOL1. The second inorganic layer IOL2 may be disposed on the organic layer OL to contact the organic layer OL.

The capping layer CPL may protect the second electrode CE of the light emitting element ELD from a follow-up process, for example, a sputtering process and improve emission efficiency of the light emitting element ELD. The capping layer CPL may have a refractive index greater than that of the first inorganic layer IOL1.

The first inorganic layer IOL1 and the second inorganic layer IOL2 may protect the display element layer DP-OLED from oxygen/moisture, and the organic layer may protect the display element layer DP-OLED from foreign substances such as dust particles. Each of the first inorganic layer IOL1 and the second inorganic layer IOL2 may be one of a silicon oxide layer, a silicon nitride layer, a silicon oxynitride layer, and a silicon oxide layer. According to an exemplary embodiment, each of the first inorganic layer IOL1 and the second inorganic layer IOL2 may include a titanium oxide layer, an aluminum oxide layer, and the like. The organic layer OL may include an acrylic-based organic layer, but is not limited thereto.

According to an exemplary embodiment of the inventive concept, an inorganic layer, for example, a lithium fluoride (LiF) layer may be further disposed between the capping layer CPL and the first inorganic layer IOL1. The LiF layer may improve emission efficiency of the light emitting element ELD.

Figure 6A:
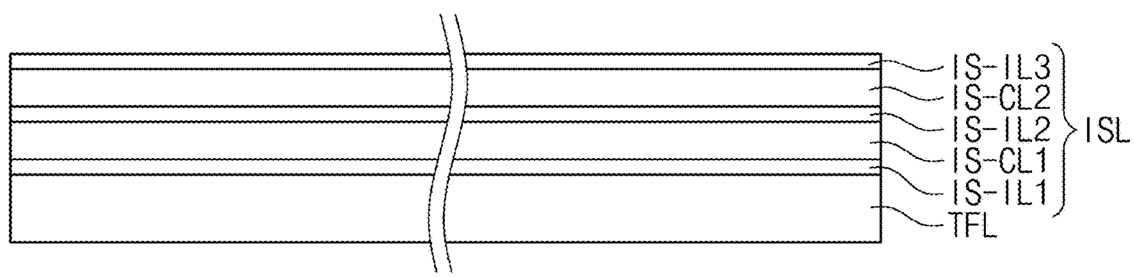
FIG. 6A is a cross-sectional view of an input sensing unit according to an exemplary embodiment of the inventive concept.
Figure 6A:
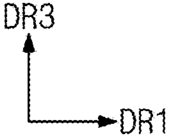
Figure 6B:
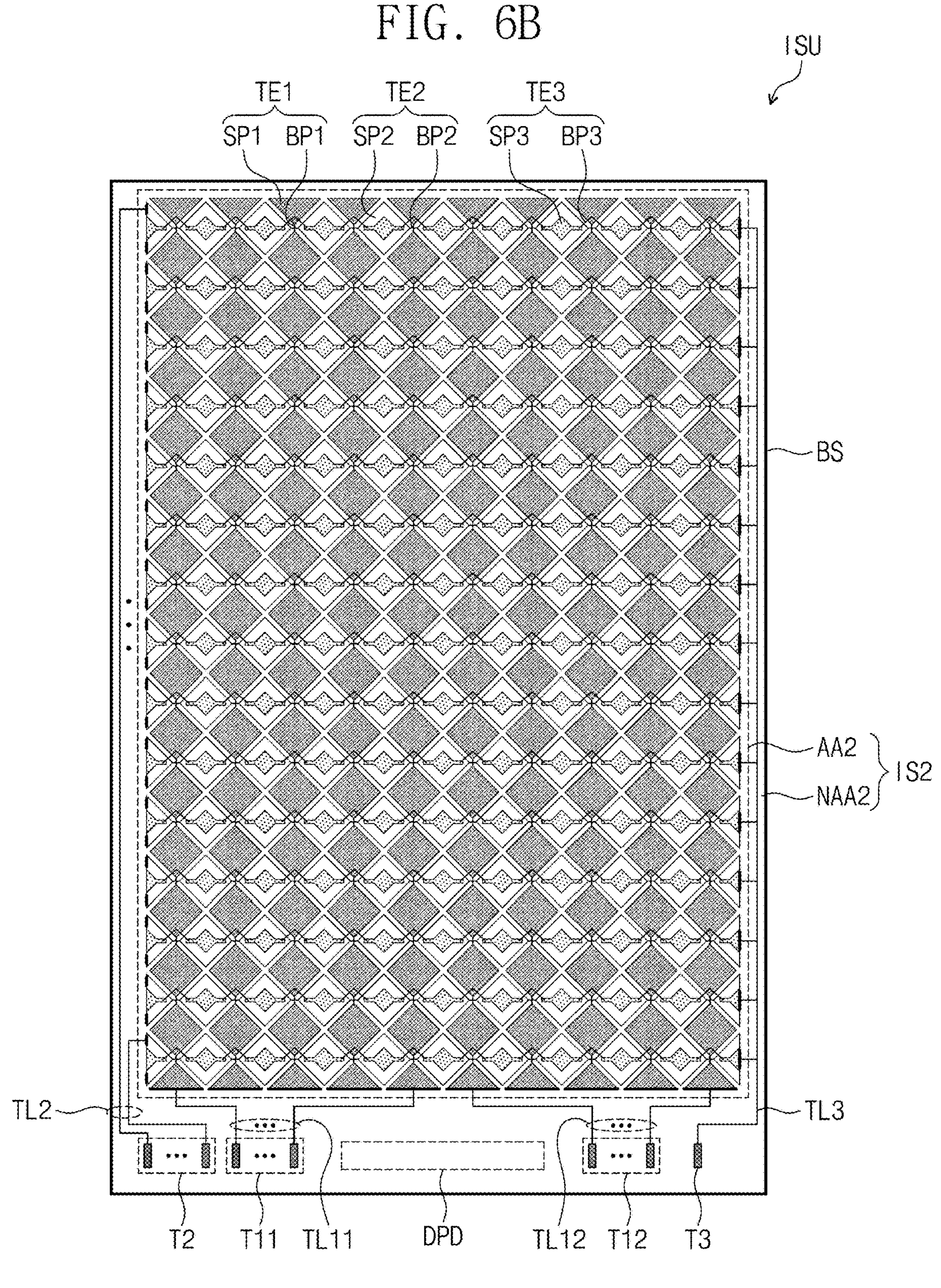
FIG. 6B is a plan view of the input sensing unit according to an exemplary embodiment of the inventive concept.
Figure 6C:
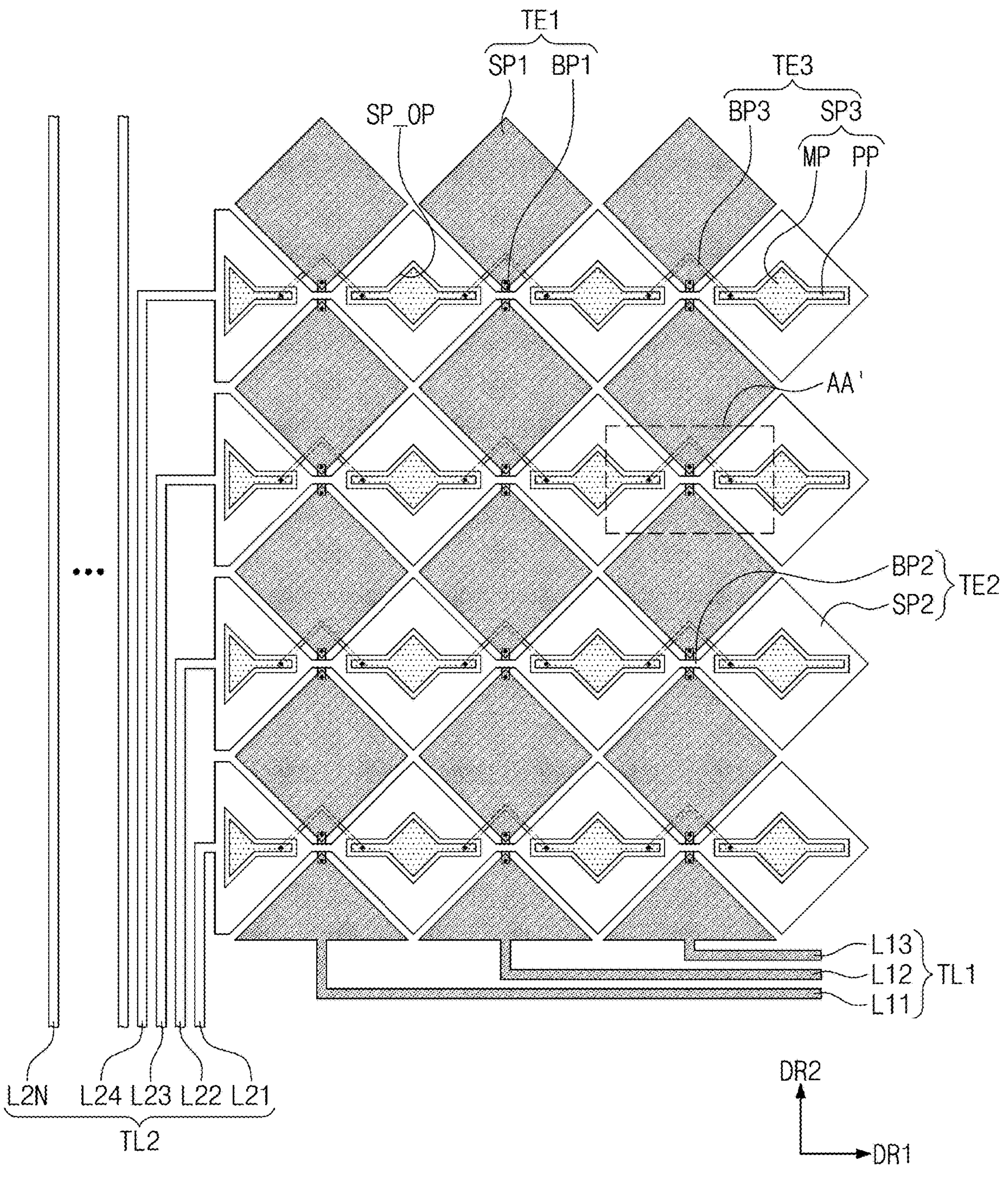
FIG. 6C is an enlarged plan view illustrating a portion of an area FIG. 6B.
Figure 6D:
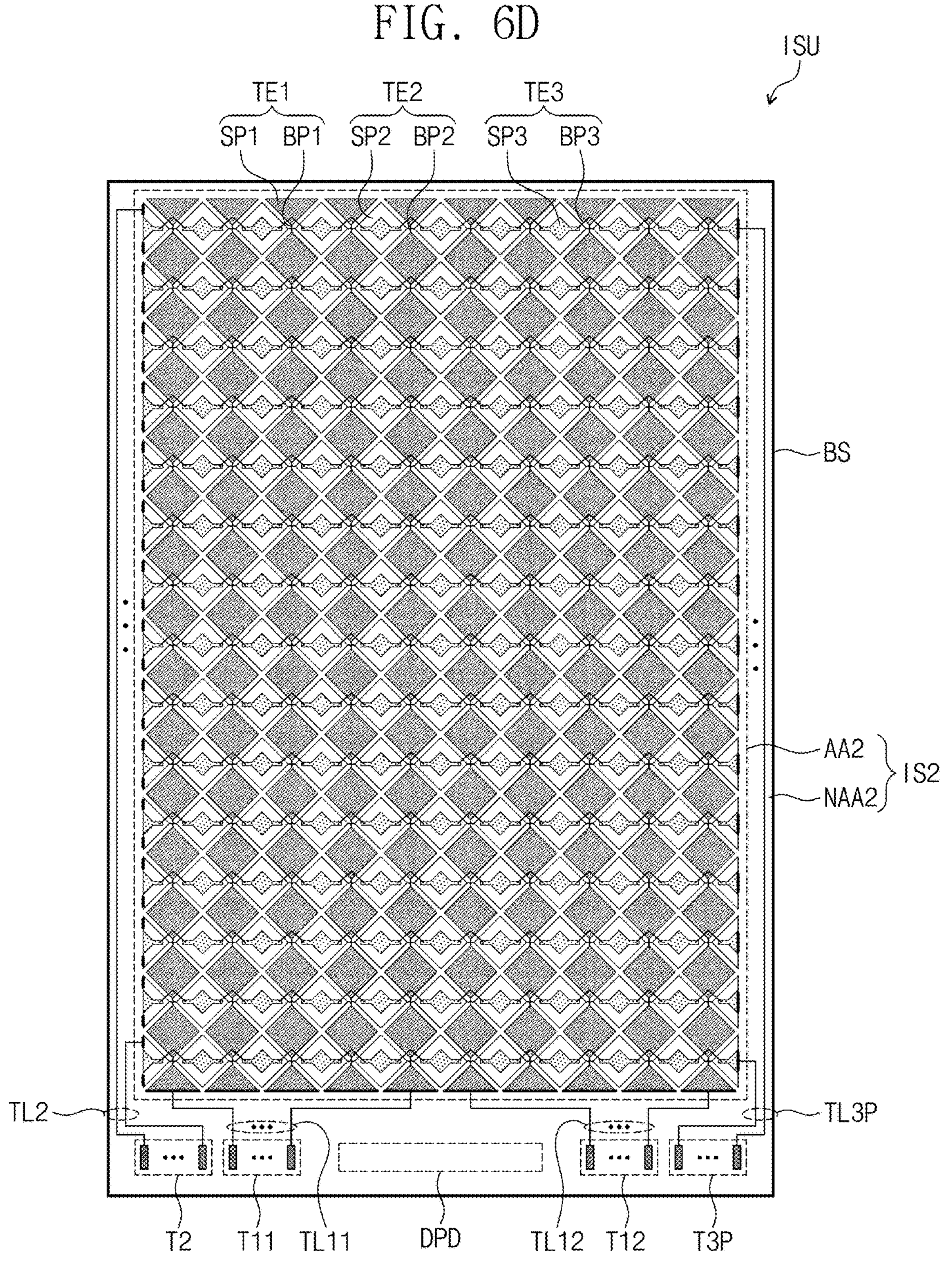
FIG. 6D is a plan view of an input sensing unit according to an exemplary embodiment of the inventive concept.

FIG. 6A is a cross-sectional view of an input sensing unit according to an exemplary embodiment of the inventive concept. FIG. 6B is a plan view of the input sensing unit according to an exemplary embodiment of the inventive concept. FIG. 6C is an enlarged plan view illustrating a portion of an area FIG. 6B. FIG. 6D is a plan view of an input sensing unit according to an exemplary embodiment of the inventive concept. Hereinafter, the present disclosure will be described with reference to FIGS. 6A to 6D.

As illustrated in FIG. 6A, the input sensing unit ISU may include a first insulation layer IS-IL1, a second conductive layer IS-CL1, a second insulation layer IS-IL2, a second conductive layer IS-CL2, and a third insulation layer IS-IL3. The first insulation layer IS-IL1 may be directly disposed on the upper insulation layer TFL. In the inventive concept, the first insulation layer IS-IL1 may be omitted.

Each of the first conductive layer IS-CL1 and the second conductive layer IS-CL2 may have a single-layer structure or a multi-layer structure in which a plurality of layers are stacked in the third directional axis DR3. The conductive layer having the multilayer structure may include at least two of the transparent conductive layers and the metal layers. The conductive layer having the multilayer structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may be formed of molybdenum, silver, titanium, copper, aluminum, and an alloy thereof. For example, each of the first and second conductive layers IS-CL1 and IS-CL2 may have a three-layered metal structure, for example, a three-layered structure of titanium/aluminum/titanium.

Each of the first and second conductive layers IS-CL1 and IS-CL2 may include a plurality of conductive patterns. Hereinafter, an example in which the first conductive layer IS-CL1 includes first conductive patterns, and the second conductive layer IS-CL2 includes second conductive patterns will be described. Each of the first and second conductive patterns may include sensing electrodes and signal lines connected to the sensing electrodes.

Each of the first and second insulation layers IS-IL1 and IS-IL2 may include an inorganic or organic material. In this exemplary embodiment, each of the first and second insulation layers IS-IL1 and IS-IL2 may be an inorganic layer including an inorganic material. The inorganic layer may include at least one of oxide, titanium oxide, silicon oxide, silicon oxide nitride, zirconium oxide, or hafnium oxide. The third insulation layer IS-IL3 may include an organic material. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Referring to FIGS. 6B and 6C, the input sensing unit ISU is disposed on the base substrate BS. The input sensing unit ISU may be disposed on the display unit DPU or the display panel DP, may be disposed between the display unit DPU and the base substrate BS, or disposed to be spaced apart from the display unit DPU with the base substrate BS therebetween.

The input sensing unit ISU provides a front surface IS2 including a sensing area AA2 and a second peripheral area NAA2. The sensing area AA2 may correspond to the active area AA (see FIG. 1) of the display apparatus DD (see FIG. 1). The second peripheral area NNA2 may correspond to the peripheral area NAA (see FIG. 1) of the display apparatus DD. In this exemplary embodiment, the display area AA1 (see FIG. 3A) and the sensing area AA2 may correspond to each other.

However, this is merely an example. For example, the display area AA1 and the sensing area AA2 may partially overlap each other. The active area AA may be an area that is substantially defined by projecting the display area AA1 and the sensing area AA2. Thus, the active area AA may include all of the display area AA1 and the sensing area AA2.

The input sensing unit ISU includes a plurality of first electrodes TE1, a plurality of second electrodes TE2, a plurality of third electrodes TE3, a plurality of sensing lines TL11, TL12, TL2, and LT3, and a plurality of sensing pads T11, T12, T2, and T3. For convenience of description, portions of the electrodes are illustrated to be shaded so that the first electrodes TE1, the second electrodes TE2, and third electrodes TE3 are distinguished from each other.

The first electrodes TE1, the second electrodes TE2, and the third electrodes TE3 are disposed on the sensing area AA2. As described above, the sensing area AA2 may overlap the display area AA1 of the display unit DPU and correspond to the active area AA of the display apparatus DD.

The sensing lines TL11, TL12, TL2, and TL3 and the sensing pads T11, T12, T2, and T3 are disposed on the peripheral area NAA2. As described above, the second peripheral area AA2 may overlap the first peripheral area NAA1 of the display unit DPU and correspond to the peripheral area NAA of the display apparatus DD.

The sensing lines TL11, TL12, TL2, and TL3 may include a plurality of first sensing lines TL11 and TL12, a plurality of second sensing lines TL2, and a third sensing line TL3. The sensing pads T11, T12, T2, and T3 include a plurality of first sensing pads T11 and T12, a plurality of second sensing pads T2, and a third sensing pad T3. The sensing lines TL11, TL12, TL2, and TL3 are connected to corresponding pads of the sensing pads T11, T12, T2, and T3, respectively.

The first electrodes TE1 are arranged in the first direction DR1. Each of the first electrodes TE1 extends in the second direction DR2. Each of the first electrodes TE1 may include a plurality of main patterns SP1 and a plurality of connection patterns BP1.

Each of the first main patterns SP1 and the first connection patterns BP1 may be arranged in the second direction DR2. Each of the first main patterns SP1 has a diamond shape. However, this is merely an example. For example, each of the first main patterns SP1 is not limited to a specific shape.

Each of the first connection patterns BP1 is disposed between the first main patterns SP1. Each of the first connection patterns BP1 connects two first main patterns SP1 adjacent to each other. The first main patterns SP1 are electrically connected through the first connection patterns BP1.

In this exemplary embodiment, the first connection patterns BP1 are disposed on a layer different from that of the first main patterns SP1. Each of the first connection patterns BP1 may partially overlap the first main patterns SP1. Each of the first main patterns SP1 may be electrically connected to the first connection patterns BP1 by passing through a predetermined insulation layer.

The first sensing lines TL1 are connected to the first electrodes TE1, respectively. The first sensing lines TL1 connect the first electrodes TE1 to the pads, which correspond to the first electrodes TE1, of the first pads T11 and T12, respectively.

In this exemplary embodiment, the first sensing lines TL1 may include first sub lines TL11 and second sub lines TL12. The first sub lines TL11 connect a portion of the first electrodes TE1 to a portion T11 of the first pads T11 and T12. The second sub lines TL12 connect a remaining portion of the first electrodes TE1 to a remaining portion T12 of the first pads T11 and T12.

For convenience of description, FIG. 6C illustrates three first sensing lines L11, L12, and L13 of the first sensing lines TL1. The three first sensing lines L11, L12, and L13 are connected to corresponding first electrodes TE1, respectively.

The first sensing lines TL1 may respectively transmit electrical signals provided through the first pads T11 and T12 to the first electrodes TE1 or may transmit electrical signals provided from the first electrodes TE1 to the outside through the first pads T11 and T12. However, this is merely an example. For example, the first pads T11 and T12 may be continuously arranged on one side of the display panel pads DPD, but the inventive concept is not limited to this specific arrangement.

Referring again to FIGS. 6B and 6C, the second electrodes TE2 are arranged in the second direction DR2. Each of the second electrodes TE2 extends in the first direction DR1. Each of the second electrodes TE2 may include a plurality of second main patterns SP2 and a plurality of second connection patterns BP2.

Each of the second main patterns SP2 and the second connection patterns BP2 may be arranged in the first direction DR1. Each of the first main patterns SP1 and the second main patterns SP2 has a diamond shape. However, this is merely an example. For example, in the inventive concept, the shape of each of the first main patterns SP1 and the second main patterns SP2 is not so limited.

Each of the second connection patterns BP2 is disposed between the second main patterns SP2. Each of the second connection patterns BP2 connects two second main patterns SP1 adjacent to each other. The second main patterns SP2 are electrically connected through the second connection patterns BP2.

In this exemplary embodiment, the second connection patterns BP2 are disposed on the same layer as the second main patterns SP2 and are thus, provided as a single body. Thus, the second electrodes TE2 may be provided as a single body that extending in the first direction DR1. However, this is merely an example. For example, the second connection patterns BP2 may be disposed on a layer different from that of the second main patterns SP2, but the inventive concept is not so limited.

The second sensing lines TL2 are connected to the second electrodes TE2, respectively. The second sensing lines TL2 connect the second electrodes TE2 to the second sensing pads T2.

For convenience of description, FIG. 6C illustrates N second sensing lines L21, L22, L23, L24, and L2N of the second sensing lines TL2. The second sensing lines L21, L22, L23, L24, and L2N are connected to corresponding second electrodes TE2, respectively. The N number may correspond to the number of second electrodes TE2 provided in the input sensing unit ISU.

The second sensing lines TL2 may transmit electrical signals provided through the second sensing pads T2 and T12 to the second electrodes TE2, or may transmit electrical signals provided from the second electrodes TE2 to the outside through the second sensing pads T2.

The second electrodes TE2 may receive an electrical signal different from that applied to the first electrodes TE1. Here, the second electrodes TE2 may generate electric fields together with the first electrodes TE1. For example, the first electrodes TE1 may receive driving signals, and the second electrodes TE2 may receive sensing signals. The input sensing unit ISU may operate in a mutual cap manner in which an external input TC (see FIG. 1) is sensed through a variation in capacitance formed between the second electrodes TE2 and the first electrodes TE1.

Alternatively, the second electrodes TE2 may receive the same type of electrical signals as the first electrodes TE1. For example, the first electrodes TE1 and the second electrodes TE2 may receive sensing signals. The input sensing unit ISU may operate in a self-cap manner in which information of the external input TC is sensed through a change in sensing signal according to the external input TC.

Referring again to FIGS. 6B and 6C, the third electrodes TE3 are arranged in the second direction DR2. Each of the third sensing electrodes TE2 extends in the first direction DR1. In this exemplary embodiment, the third electrodes TE3 may extend and be arranged in parallel to the second electrode TE2.

Each of the third electrodes TE3 may include a plurality of third main patterns SP3 and a plurality of third connection patterns BP3. Each of the third main patterns SP3 and the third connection patterns BP3 may be arranged in the first direction DR1.

The third main patterns SP3 may be disposed inside the second main patterns SP2. In this exemplary embodiment, the third main patterns SP3 may be respectively disposed in predetermined openings SP-OP respectively defined in the second main patterns SP2.

The third main patterns SP3 may be accommodated in the openings SP-OP and spaced apart from the second main patterns SP2 in a plan view. In this exemplary embodiment, the third main patterns SP3 and the second main patterns SP2 may not overlap each other in a plan view. In this exemplary embodiment, each of the third main patterns SP3 may be surrounded by each of the second main patterns SP2.

Each of the third main patterns SP3 may include a first portion MP and a second portion PP. The first portion MP may have a shape similar to that of each of the second main patterns SP2. In this exemplary embodiment, the first portion MP may have a diamond shape having a size less than that of each of the second main patterns SP2.

The second portion PP is connected to one side of the first portion MP. The second portion PP may have a bar shape extending in the first direction DR1 as an example. In this exemplary embodiment, the second portion PP may be provided in plurality and connected to both sides opposed to each other in the first direction DR1.

Each of the third connection patterns BP3 is disposed between the third main patterns SP3. Each of the third connection patterns BP3 connects two third main patterns SP3 adjacent to each other. The third main patterns SP3 are electrically connected through the third connection patterns BP3. However, this is merely an example. For example, the third electrodes TE3 may be arranged in the first direction DR1, but the inventive concept is not so limited.

The third connection patterns BP3 may be spaced apart from the first connection patterns BP1 in a plan view. The third connection patterns BP3 may be disposed so that the third connection patterns BP3 do not overlap the first connection patterns BP1 in a plan view. Each of the third connection patterns BP3 according to this exemplary embodiment may have a shape that is bent at least once in the first direction DR1. In this exemplary embodiment, each of the third connection patterns BP3 has a shape that is bent once.

Each of the third connection patterns BP3 may be spaced apart from the first connection patterns BP1 through the bent shape thereof to overlap the first main patterns SP1 in a plan view. Since each of the third connection patterns BP3 according to the inventive concept has the bent shape, the third connection patterns BP3 may be stably connected to the third main patterns SP3 without interfering with the second connection patterns BP2.

The third sensing line TL3 is connected to the third electrodes TE3, respectively. The third sensing line TL3 connects the third pad T3 to the third electrodes TE3. In this exemplary embodiment, each of the third pad T3 and the third sensing line TL3 is provided as a single body. The third electrodes TE3 may receive a ground voltage through the third pad T3.

According to an exemplary embodiment of the inventive concept, the input sensing unit ISU may further include a third electrode TE3 receiving the ground voltage. Thus, a signal failure such as noise in the input sensing unit ISU by the electrical signal provided to the display unit DPU may be prevented from occurring. Thus, deterioration in sensitivity of the input sensing unit ISU may be easily prevented.

Also, according to the inventive concept, the third connection patterns BP3 constituting the third electrode TE3 may be designed so that the third connection patterns BP3 do not overlap the first connection patterns BP1 disposed on the same layer to prevent the third electrode TE3 and the first electrode TE1 from interfering with each other. Thus, electrical reliability of the input sensing unit ISU may be improved.

As illustrated in FIG. 6D, in the input sensing unit ISU, each of the third sensing line TL3 and the third pad T3 may be provided in plurality. The plurality of third sensing units TL3P and the plurality of third pads T3P may be connected to corresponding third electrodes TE3, respectively. Here, the third electrodes TE3 may receive electrical signals for sensing noise in the active area AA. According to the inventive concept, the input sensing unit ISU may be designed with various structures, but the inventive concept is not so limited.

Figure 7:
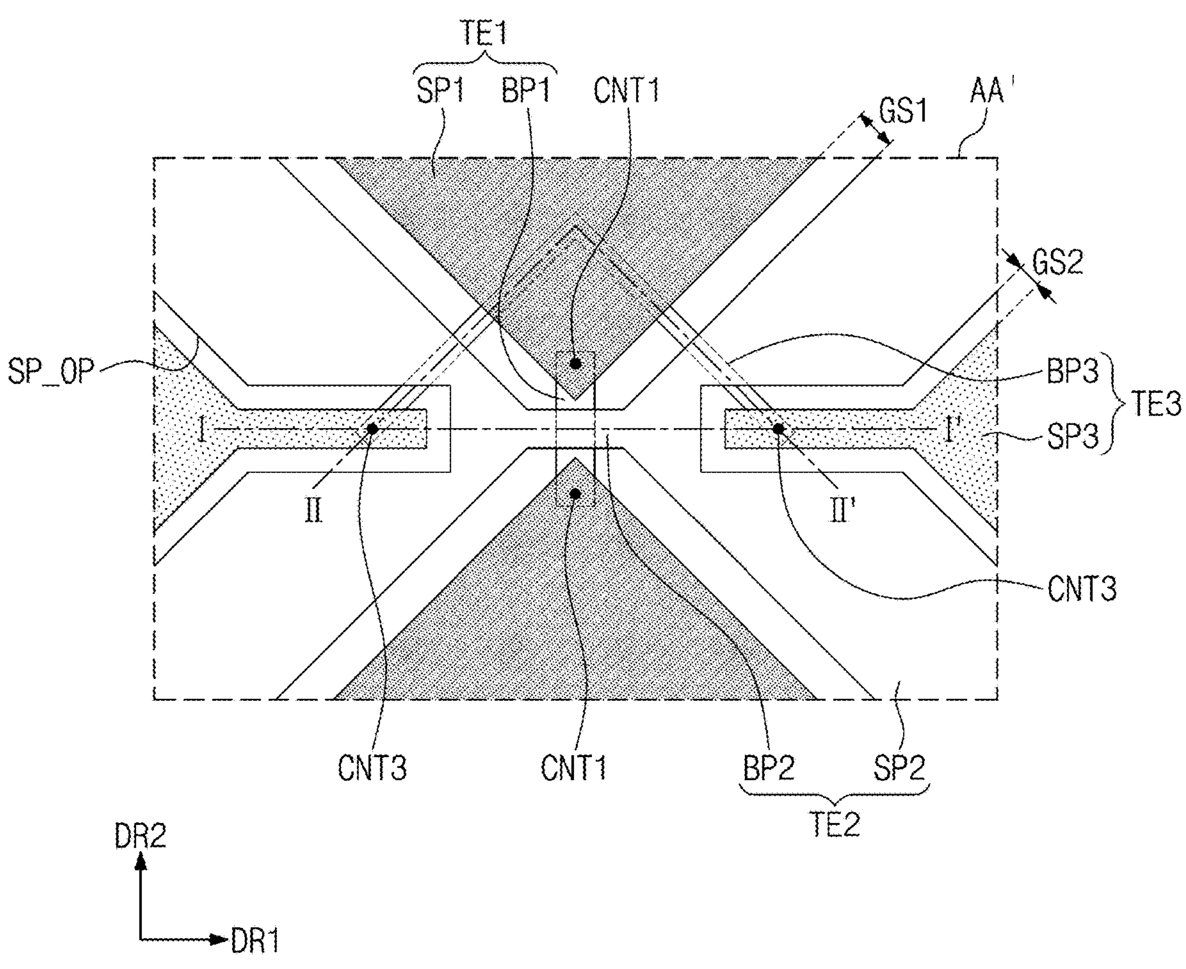
FIG. 7 is a plan view illustrating a portion of the input sensing unit according to an exemplary embodiment of the inventive concept.
Figure 8A:
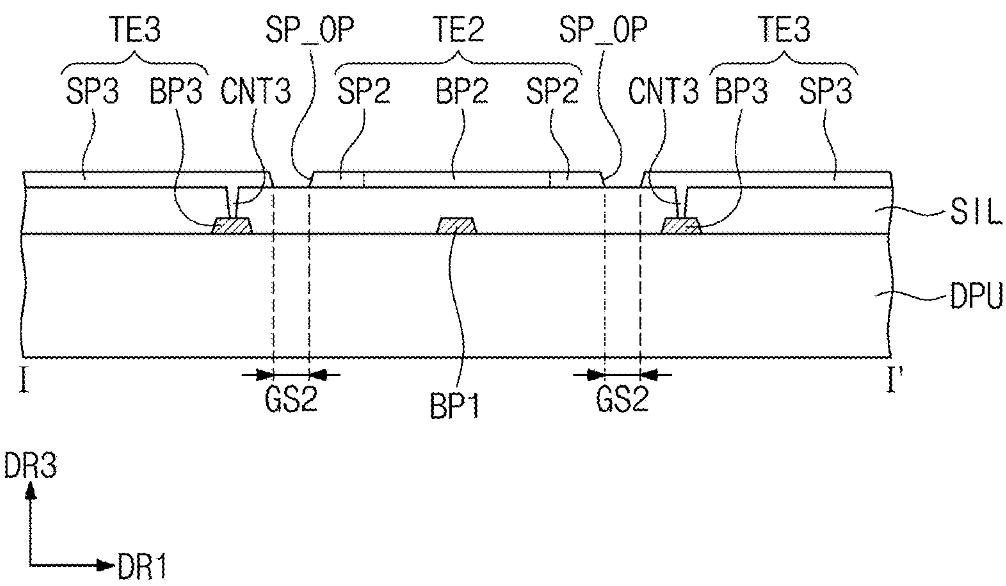
FIGS. 8A and 8B are cross-sectional views illustrating a portion of the input sensing unit according to an exemplary embodiment of the inventive concept.
Figure 8B:
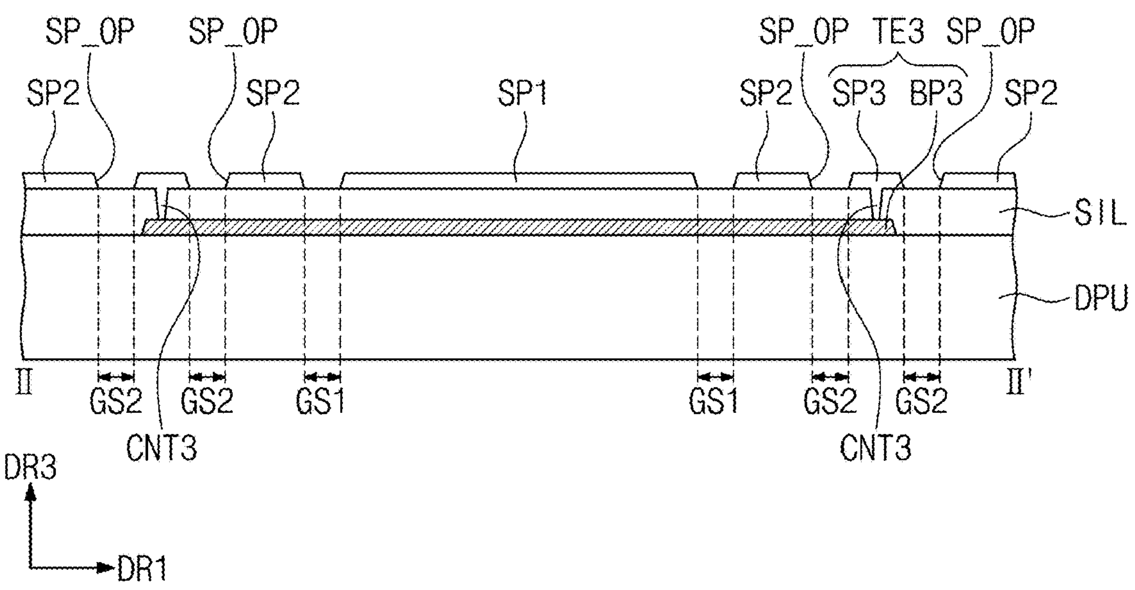

FIG. 7 is a plan view illustrating a portion of the input sensing unit according to an input sensing unit ISU embodiment of the inventive concept. FIGS. 8A and 8B are cross-sectional views illustrating a portion of the input sensing unit according to an input sensing unit ISU embodiment of the inventive concept. FIG. 7 illustrates an area AA' of FIG. 6C. FIG. 8A illustrates a cross-section taken along line I-I' of FIG. 7B, and FIG. 8B illustrates a cross-section taken along line II-II' of FIG. 7B. Hereinafter, the present invention will be described with reference to FIGS. 7 to 8B. The same reference numeral may be given to components that are the same as those of FIGS. 1 to 6C, and their detailed descriptions will be omitted.

For convenience of description, FIG. 7 illustrates an area on which one first connection pattern BP1, one second connection pattern BP2, and one third connection pattern BP3 are disposed.

The first main patterns SP1 and the second main patterns SP1 may be disposed on the same layer and spaced apart from each other. A predetermined space GS1 may be defined between the first main patterns SP1 and the second main patterns SP2. Although not shown, a floating pattern spaced from the first main patterns SP1 and the second main patterns SP2 may be further disposed in the spaced space GS1 between the first main patterns SP1 and the second main patterns SP2.

The second main patterns SP2 and the third main patterns SP3 may be disposed on the same layer and spaced apart from each other. In this exemplary embodiment, the third main patterns SP3 may be respectively disposed on predetermined openings SP-OP defined in the second main patterns SP2. Thus, a predetermined space GS2 may be defined between the second main patterns SP2 and the third main patterns SP3. The second main patterns SP2 and the third main patterns SP3 may not overlap each other in a plan view.

In this exemplary embodiment, the first connection pattern BP1 and the second connection pattern BP2 may be disposed on a layer different from that of the first main patterns SP1, the second main patterns SP2, the second connection pattern BP2, and the third main patterns SP3 with a predetermined insulation layer SIL therebetween.

The first connection pattern BP1 is disposed on a layer different from that of the second connection pattern BP2. In this exemplary embodiment, the first connection pattern BP1 may cross the first connection pattern BP2 in a plan view. The first connection pattern BP1 may be connected to the first main patterns SP1 through a contact part CNT1 passing through the insulation layer SIL.

The third connection pattern BP3 and the first connection pattern BP1 may be disposed on the same layer. The third connection pattern BP3 may be connected to the third main patterns SP3 through a contact part CNT3 passing through the insulation layer SIL.

The third connection pattern BP3 may be spaced apart from the first connection pattern BP1 in a plan view. The third connection pattern BP3 may not overlap the first connection pattern BP1. As described above, the third connection pattern BP3 may be bent in a plan view in the first direction DR1 so as to be spaced apart from the first connection pattern BP1 to overlap the first main patterns SP1.

According to the inventive concept, the third connection patterns BP3 may be connected to the third main patterns SP3 and the first main patterns SP1 without any possibility of an electrical short-circuit with respect to each other even though the third connection patterns BP3 are disposed on the same layer. Thus, the input sensing unit ISU may be improved in electrical reliability.

Figure 9:
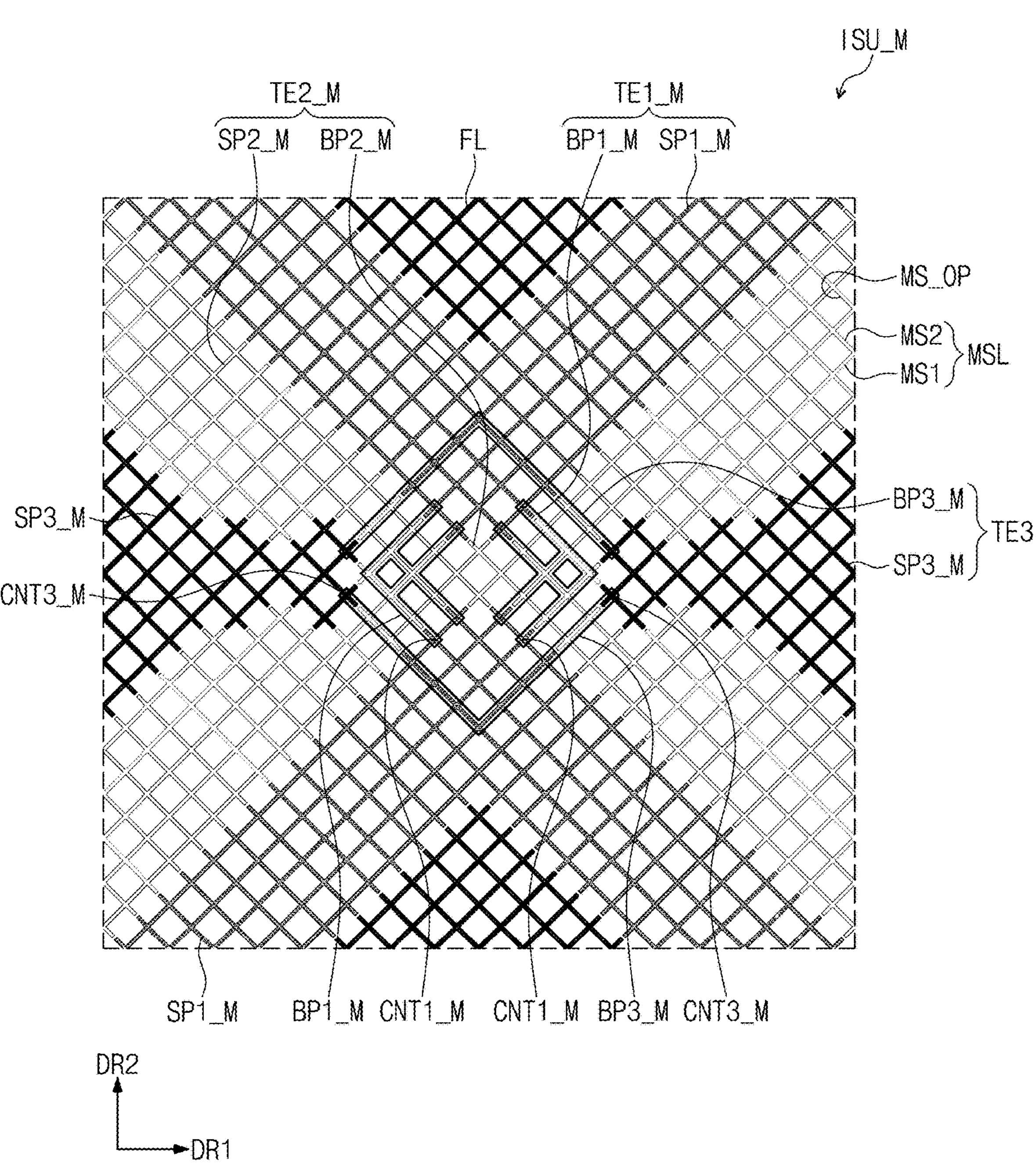
FIG. 9 is a plan view illustrating a portion of an input sensing unit according to an exemplary embodiment of the inventive concept.
Figure 10A:
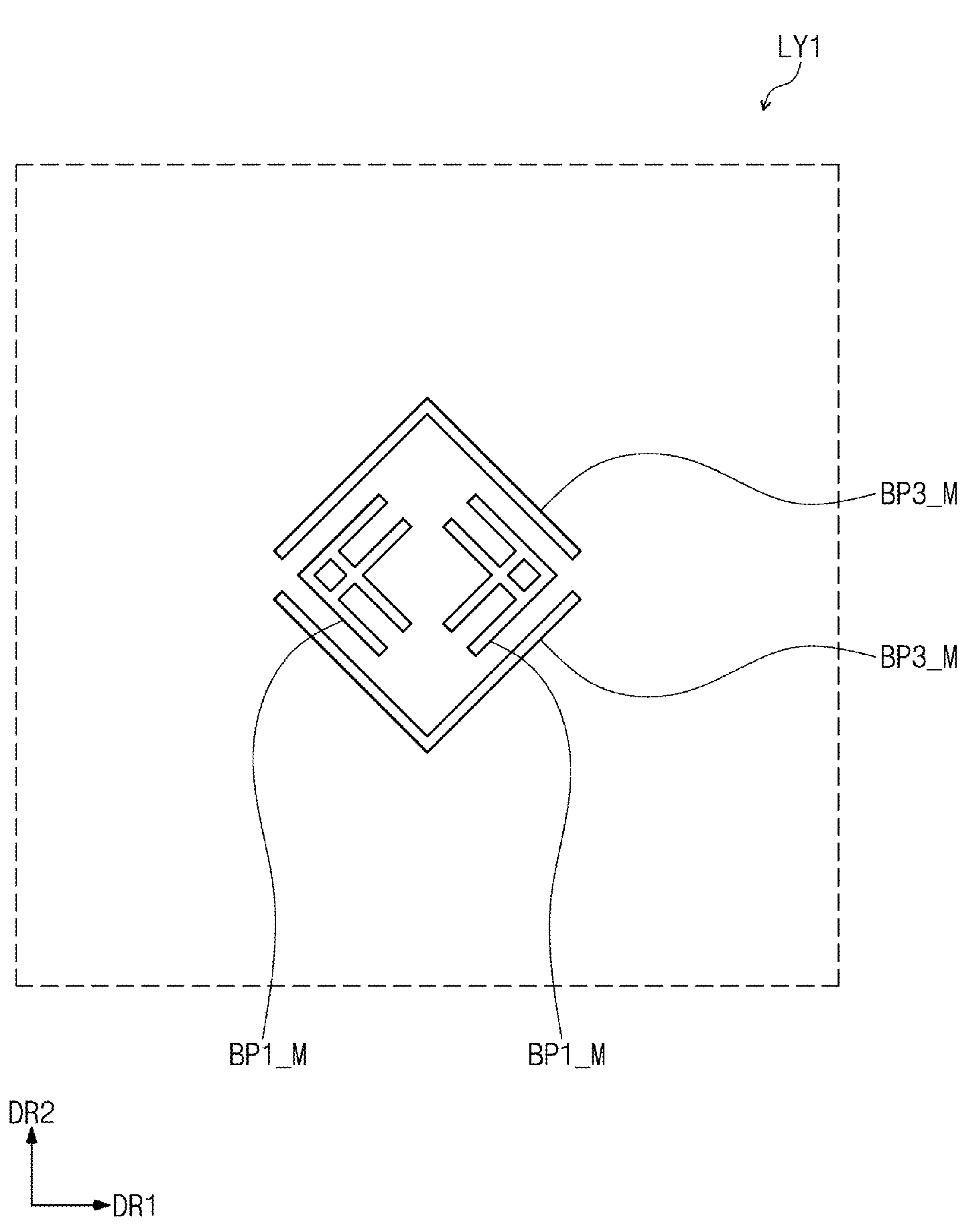
FIGS. 10A, 10B, and 10C are plan views illustrating portions of the input sensing unit according to an embodiment of the inventive concept.
Figure 10B:
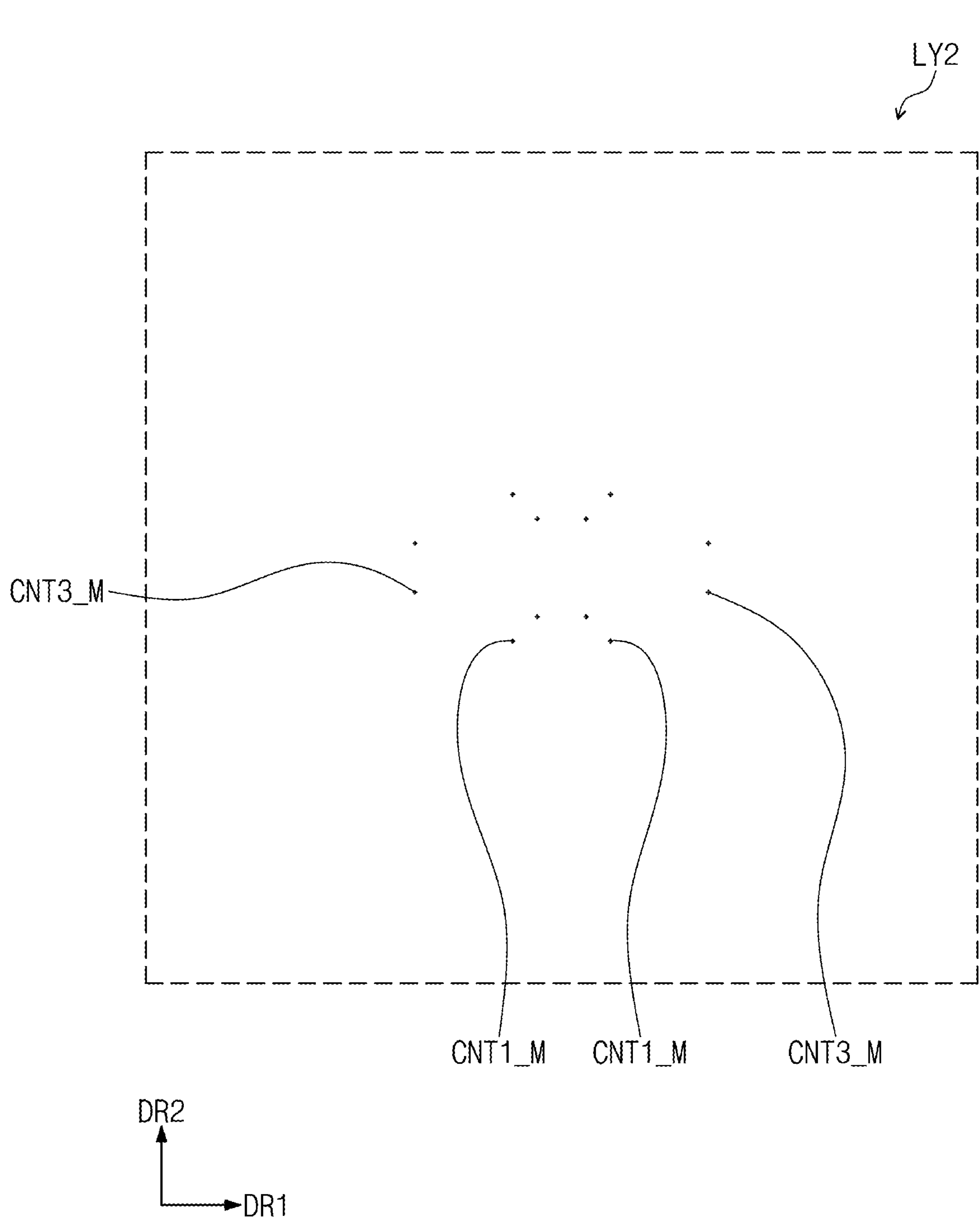
Figure 10C:
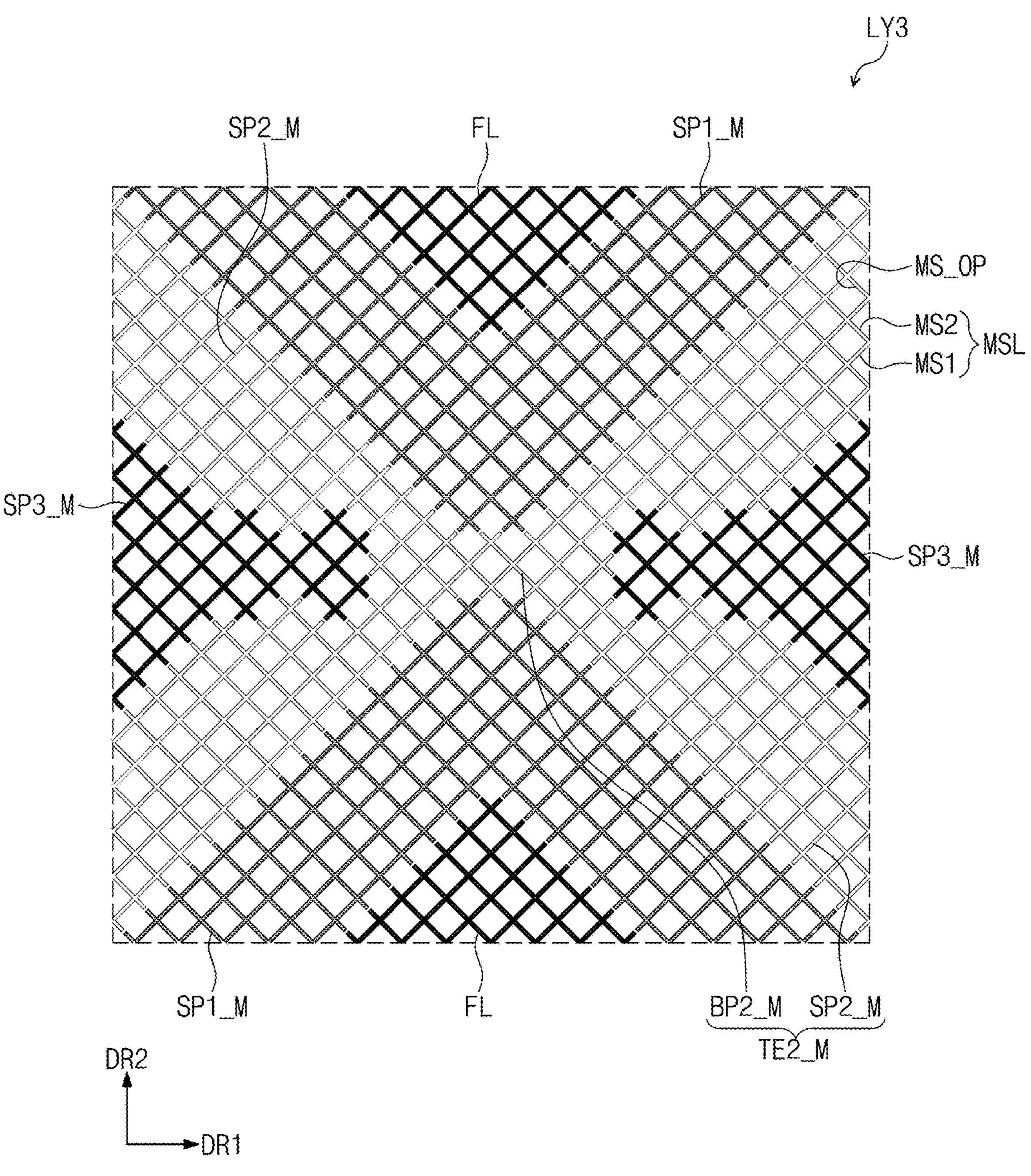

FIG. 9 is a plan view illustrating a portion of an input sensing unit according to an exemplary embodiment of the inventive concept. FIGS. 10A to 10C are plan views illustrating portions of the input sensing unit according to an exemplary embodiment of the inventive concept; For convenience of description, FIG. 9 illustrates an area corresponding to that of FIG. 7, and FIGS. 10A to 10C illustrate interlayer plan views of the area of FIG. 9. Hereinafter, the inventive concept will be described with reference to FIGS. 9 to 10C. The same reference numeral may be given to components that are the same as those of FIGS. 1 to 8B, and their detailed descriptions will be omitted.

As illustrated in FIG. 9, the input sensing unit ISU_M may include a plurality of mesh lines MSL. The mesh lines MSL include a first mesh line MS1 and a second mesh line MS2, which extend in a direction crossing the first direction DR1 and the second direction DR2 and cross each other. Predetermined openings MS_OP (hereinafter, referred to as mesh openings) are defined in the mesh lines MSL. Each of the mesh openings MS_OP may correspond to the above-described emission area PXA (see FIG. 5). Thus, even though the mesh lines MSL are made of an optically opaque material, an influence of the input sensing unit ISU_M on the emission area PXA may be minimized to prevent deterioration in the display characteristics of the display apparatus.

The mesh lines MSL may be a constituent of each of a first electrode TE1_M, a second electrode TE2_M, and a third electrode TE3_M. Particularly, each of first main patterns SP1_M, second main patterns SP2_M, third main patterns SP3_M, and a second connection pattern BP2_M may include the mesh lines MSL. Cut spaces of the mesh lines MSL may define boundaries between the first main patterns SP1_M, the second main patterns SP2_M, the third main patterns SP3_M, and the second connection pattern BP2_M.

The first connection pattern BP1_M may be provided in plurality in the first direction DR1. The first connection pattern BP1_M may include a portion that is bent in the second direction DR2. Thus, the first connection pattern BP1_M may not overlap the second connection pattern BP2_M in a plan view and may overlap the second main pattern SP2_M in a plan view.

The third connection pattern BP3_M is disposed to be spaced apart from the first connection pattern BP1_M. The second connection pattern BP3_M may be provided in plurality in the second direction DR2. The third connection pattern BP1_M may include a portion that is bent in the first direction DR1. Thus, the third connection pattern BP3_M may not overlap the second connection pattern BP2_M and the first connection pattern BP1_M in a plan view and may overlap the first main patterns SP1_M in a plan view.

According to the inventive concept, the first connection pattern BP1_M and the third connection pattern BP3_M are disposed on a layer different from that of the mesh lines MSL. Referring to FIGS. 10A to 10C, the first connection pattern BP1_M and the third connection pattern BP3_M may constitute a first layer LY1, the mesh lines MSL may constitute a third layer LY3, and the contact parts CNT1_M and CNT3_M may constitute a second layer LY2.

Particularly, the first connection pattern BP1_M and the third connection pattern BP3_M are disposed on the first layer LY1. The first layer LY1 may be a layer disposed below the insulation layer SIL (see FIG. 8A). The first connection pattern BP1_M and the third connection pattern BP3_M may be separated from the first main patterns SP1_M, the second main patterns SP2_M, the third main patterns SP3_M, and the second connection pattern BP2_M and then provided as different layers.

The first connection pattern BP1_M and the third connection pattern BP3_M may extend along the mesh lines MSL. Each of the first connection pattern BP1_M and the third connection pattern BP3_M may have a shape corresponding to the mesh lines MSL. Thus, each of the first connection pattern BP1_M and the third connection pattern BP3_M may have a shape formed by removing a portion of the mesh lines MSL. Thus, an influence of the first connection pattern BP1_M and the third connection pattern BP3_M on the emission area PXA may be reduced.

The second layer LY2 may correspond to the insulation layer SIL. The insulation layer SIL in which the contact parts CNT1_M and CNT3_M are defined may be disposed on the first connection pattern BP1_M and the third connection pattern BP3_M. The contact parts CNT1_M and CNT3_M may be defined to pass through an area, on which connection between the insulation layer SIL and the mesh lines MSL is required, of the area overlapping the first connection pattern BP1_M and the third connection pattern BP3_M.

The third layer LY3 may be a layer disposed on the insulation layer SIL. The mesh lines MSL are disposed on the insulation layer SIL. That is, each of the first main patterns SP1_M, the second main patterns SP2_M, the third main patterns SP3_M, and the second connection pattern BP2_M may be disposed on the uppermost layer of the input sensing unit ISU_M. Portions of the first main patterns SP1_M, the second main patterns SP2_M, the third main patterns SP3_M, and the second connection pattern BP2_M, which overlap the contact parts CNT1_M and CNT3_M, may pass through the insulation layer SIL and be connected to the first connection pattern BP1_M and the third connection pattern BP3_M.

The input sensing unit ISU_M according to an exemplary embodiment of the inventive concept may further include floating patterns FL disposed inside the first main patterns SP1_M. The floating patterns FL may be disposed in predetermined openings defined in the first main patterns SP1_M. The floating patterns FL are disposed to be spaced apart from the first main patterns SP1_M. According to the inventive concept, since the floating patterns FL are further provided, it may be difficult to distinguish the second electrodes TE2_M1 and the first electrodes TE1_M, which are disposed on the third main patterns SP3_M, from each other. Thus, the visibility of the input sensing unit ISU_M may be improved.

In addition, according to the inventive concept, since the floating patterns FL are further provided, deterioration in sensitivity of the input sensing unit ISU_M according to the electrical signal applied to the display unit DPU may be prevented. Thus, the input sensing unit ISU_M may be improved in electrical reliability.

Figure 11:
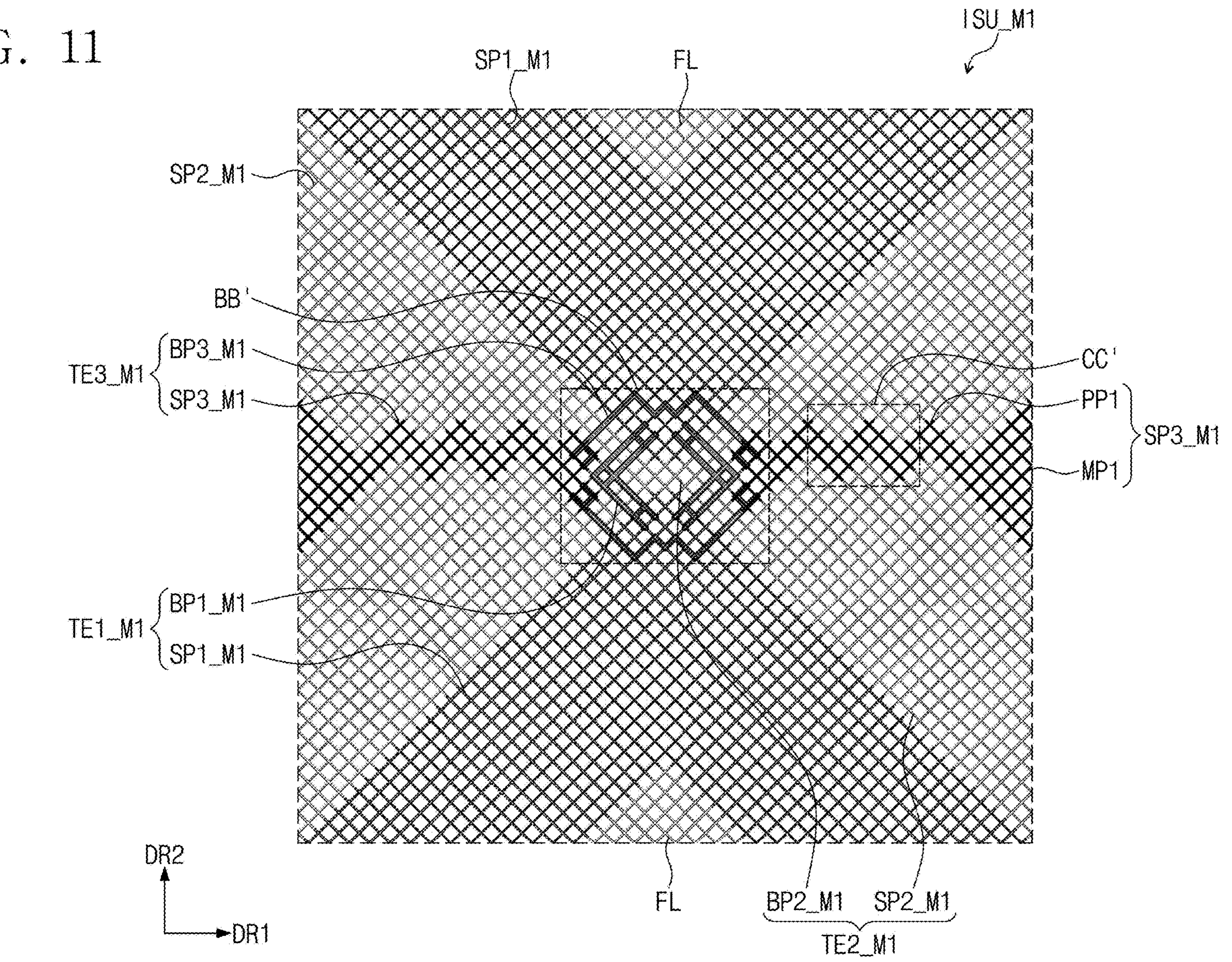
FIG. 11 is a plan view of an input sensing unit according to an exemplary embodiment of the inventive concept.
Figure 12A:
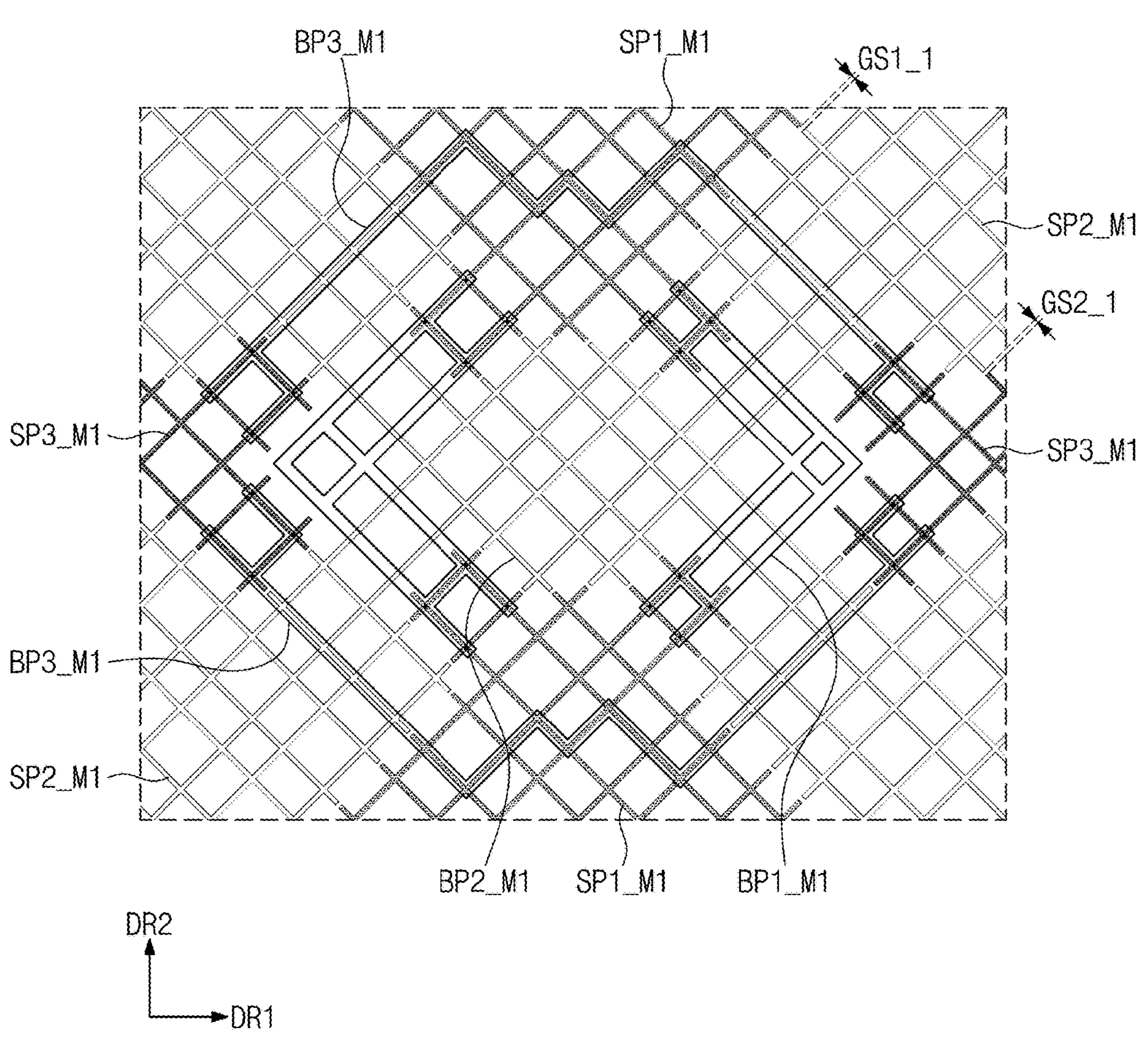
FIGS. 12A, 12B, and 12C are plan views of an input sensing unit according to an exemplary embodiment of the inventive concept.
Figure 12B:
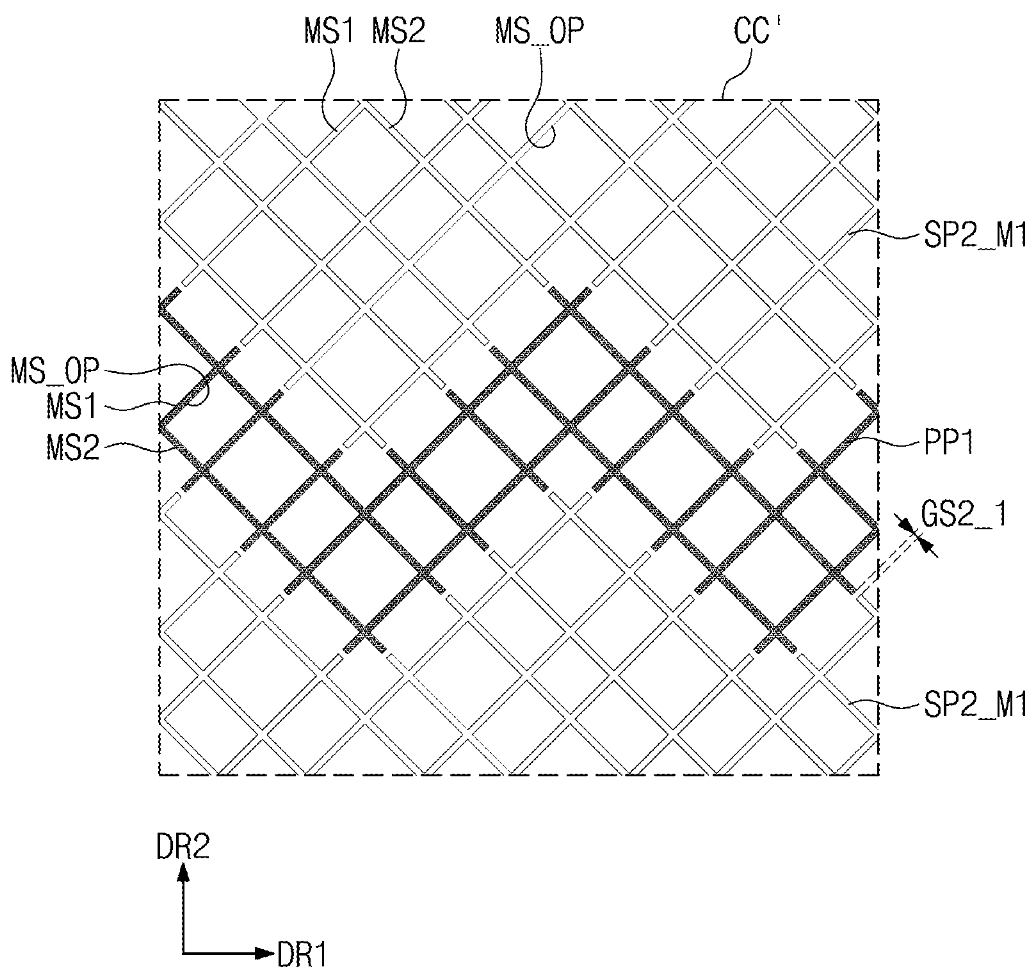
Figure 12C:
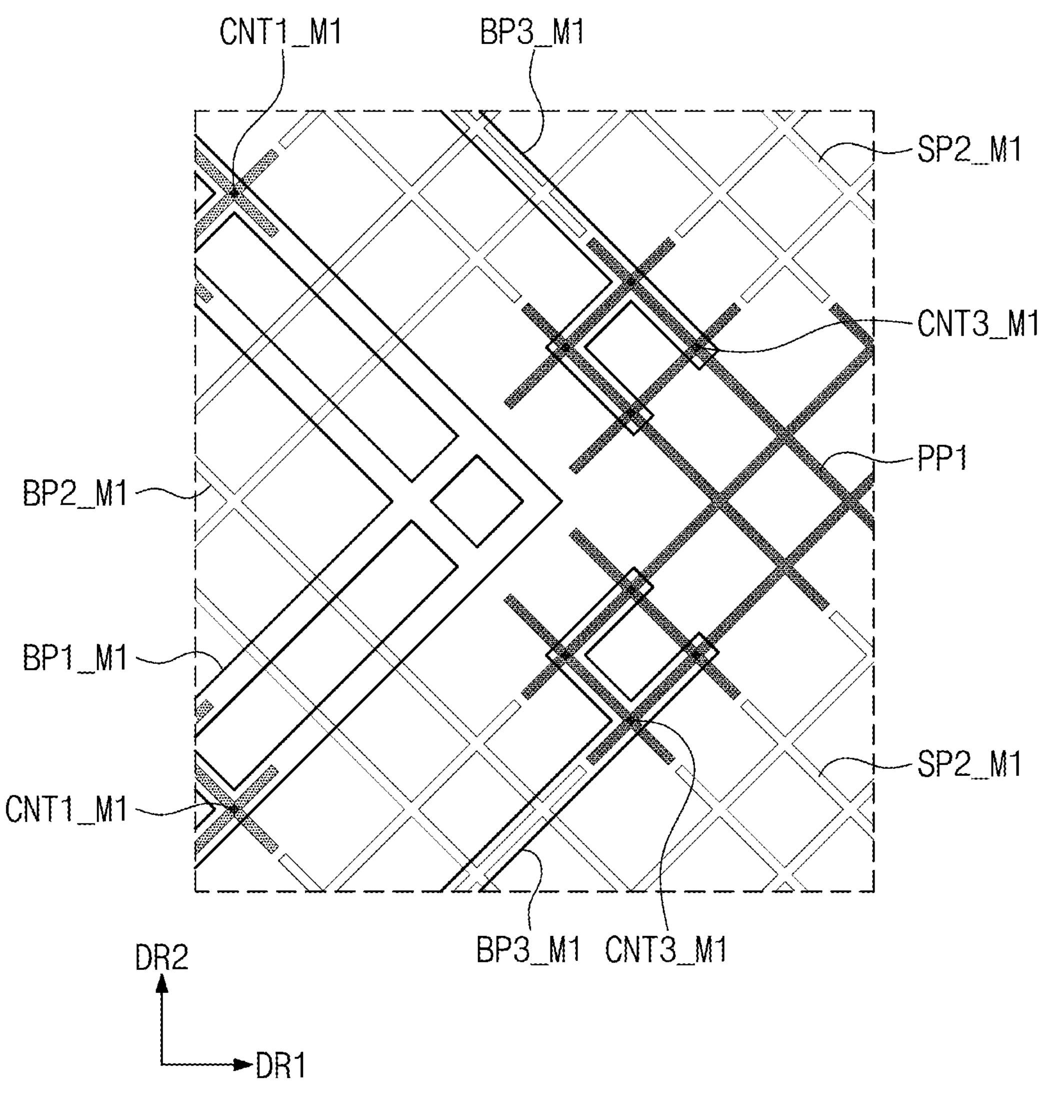

FIG. 11 is a plan view of an input sensing unit according to an exemplary embodiment of the inventive concept. FIGS. 12A to 12C are plan views of an input sensing unit according to an exemplary embodiment of the inventive concept. FIG. 12A illustrates an enlarged view of an area BB' of FIG. 11, and FIG. 12B illustrates an enlarged view of a portion of the area of FIG. 12A. FIG. 12C illustrates an enlarged plan view of an area CC' of FIG. 11. Hereinafter, the inventive concept will be described with reference to FIGS. 11 to 12C. The same reference numeral may be given to components that are the same as those of FIGS. 1 to 10C, and their detailed descriptions will be omitted.

FIG. 11 illustrates a portion of an area of the input sensing unit ISU_M1 on the basis of an area on which a first connection pattern BP1_M1, a second connection pattern BP2_M1, and a third connection pattern BP3_M1 are disposed. Also, FIG. 11 illustrates a portion of two first main patterns SP1_M1 disposed to be spaced apart from each other with the first connection pattern BP1_M1 therebetween in the second direction DR2, a portion of two second main patterns SP2_M1 disposed to be spaced apart from each other with the second connection pattern BP2_M1 therebetween in the first direction DR1, and a portion of two third main patterns SP3_M1 disposed to be spaced apart from each other with the third connection pattern BP3_M1 in the second direction DR2. The input sensing unit ISU_M1 according to inventive concept includes a plurality of mesh lines MSL.

As illustrated in FIGS. 11 and 12A, in the input sensing unit ISU_M1, each of the first connection pattern BP1_M1 and the third connection pattern BP3_M1 may have various shapes. For example, the first connection pattern BP1_M1 may be provided in plurality to be spaced apart from each other in the first direction DR2 so as to be respectively connected to the first main patterns SP1_M1.

Each of the first connection patterns BP1_M1 extends along a portion of the mesh lines MSL. Thus, each of the first connection patterns BP1_M1 may not overlap mesh openings MS_OP and substantially expose the emission areas PXA. Thus, deterioration in display characteristic of the display apparatus due to lamination with the input sensing unit ISU_M may be prevented.

The third connection pattern BP3_M1 extends along a portion of the mesh lines MSL. The third connection pattern BP3_M1 may be spaced apart from the first connection pattern BP1_M1 in a plan view. FIG. 12B illustrates an enlarged view of a portion of the area of FIG. 12A, which is adjacent to the third connection pattern BP3_M1, the first connection pattern BP1_M1, and the second connection pattern BP2_M1.

Referring to FIGS. 12A and 12B, the third connection pattern BP3_M1 may be spaced apart from the first connection pattern BP1_M1 in a plan view. The third connection pattern BP1_M1 may partially overlap the first main patterns SP1_M1 in a plan view. According to the inventive concept, electrical short-circuits between the third connection pattern BP3_M1 and the first connection pattern BP1_M1, which are disposed on the same layer, may be prevented.

Also, the third connection pattern BP3_M1 may be bent so that the third connection pattern BP3_M1 does not overlap the second connection pattern BP2_M1 in a plan view. The third connection pattern BP3_M1 may have a shape that is bent at least once in the first direction DR1. In this embodiment, the third connection pattern BP3_M1 may have a zigzag shape that is bent several times in the first direction DR1. According to the inventive concept, since the third connection pattern BP3_M1 is designed to have the bent shape, a non-overlapping portion between the third connection pattern BP3_M1 and the first connection pattern BP1_M1 may increase to easily prevent interference with the emission area PXA.

Referring to FIGS. 11 and 12C, each of the third main patterns SP3_M1 may include a first portion MP1 and a second portion PP1. Each of the first portion MP1 and the second portion PP1 may be disposed to be spaced a predetermined distance from the second main patterns SP2_M1.

The second portion PP1 may have a shape that is bent at least once in the first direction DR1. The second portion PP1 according to this exemplary embodiment may have a zigzag shape extending in the first direction DR1. According to the inventive concept, the second portion PP1 may be designed to be bent several times, thereby preventing a boundary between the third main patterns SP3_M1 and the second main patterns SP_M1, which are disposed inside the second main patterns SP2_M1, for example, a space GS1_M1 from easily visible. Also, it may be difficult to distinguish the third main patterns SP3_M1 from the second main patterns SP2_M1. Thus, the input sensing unit ISU_M1 may be improved in visibility.

Figure 13A:
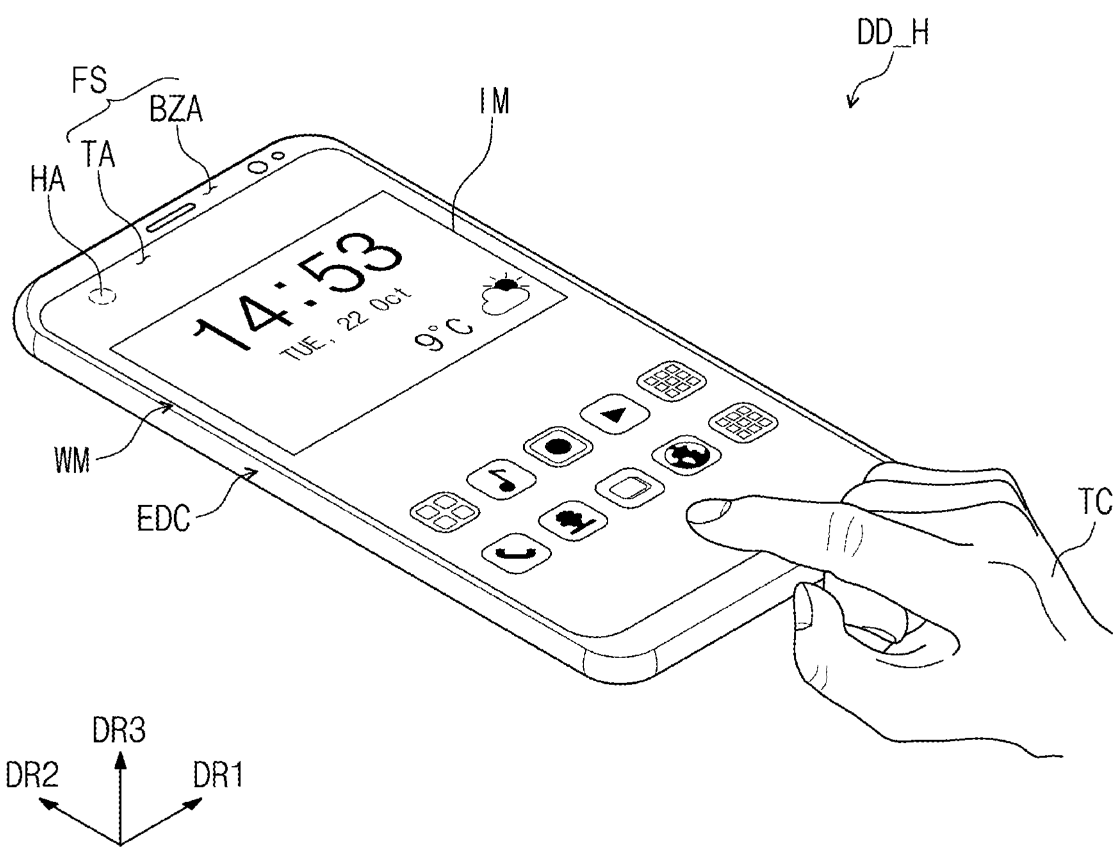
FIG. 13A is a perspective view illustrating a coupled state of the display apparatus according to an exemplary embodiment of the inventive concept.
Figure 13B:
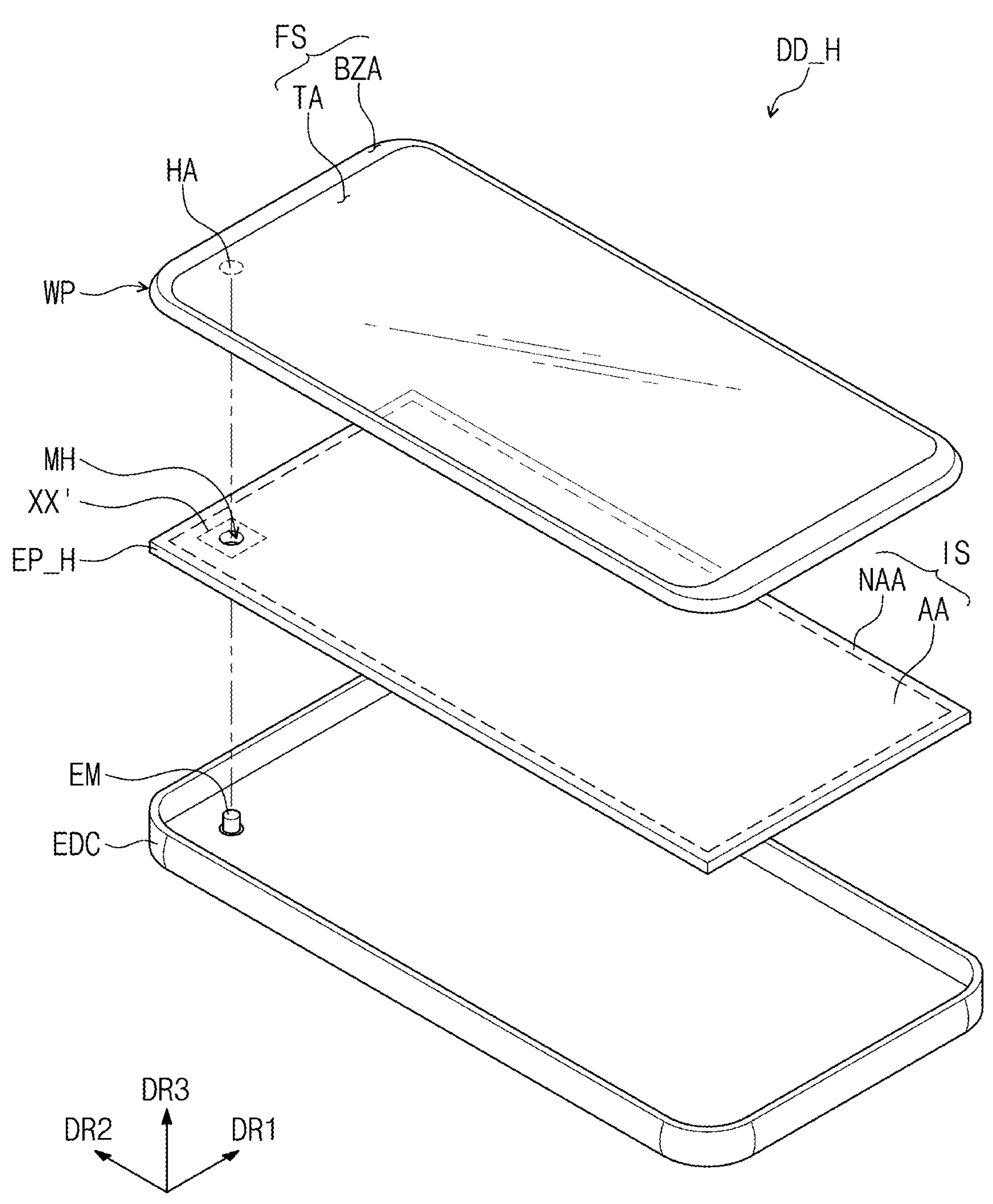
FIG. 13B is an exploded perspective view of the display apparatus of FIG. 13A.
Figure 14A:
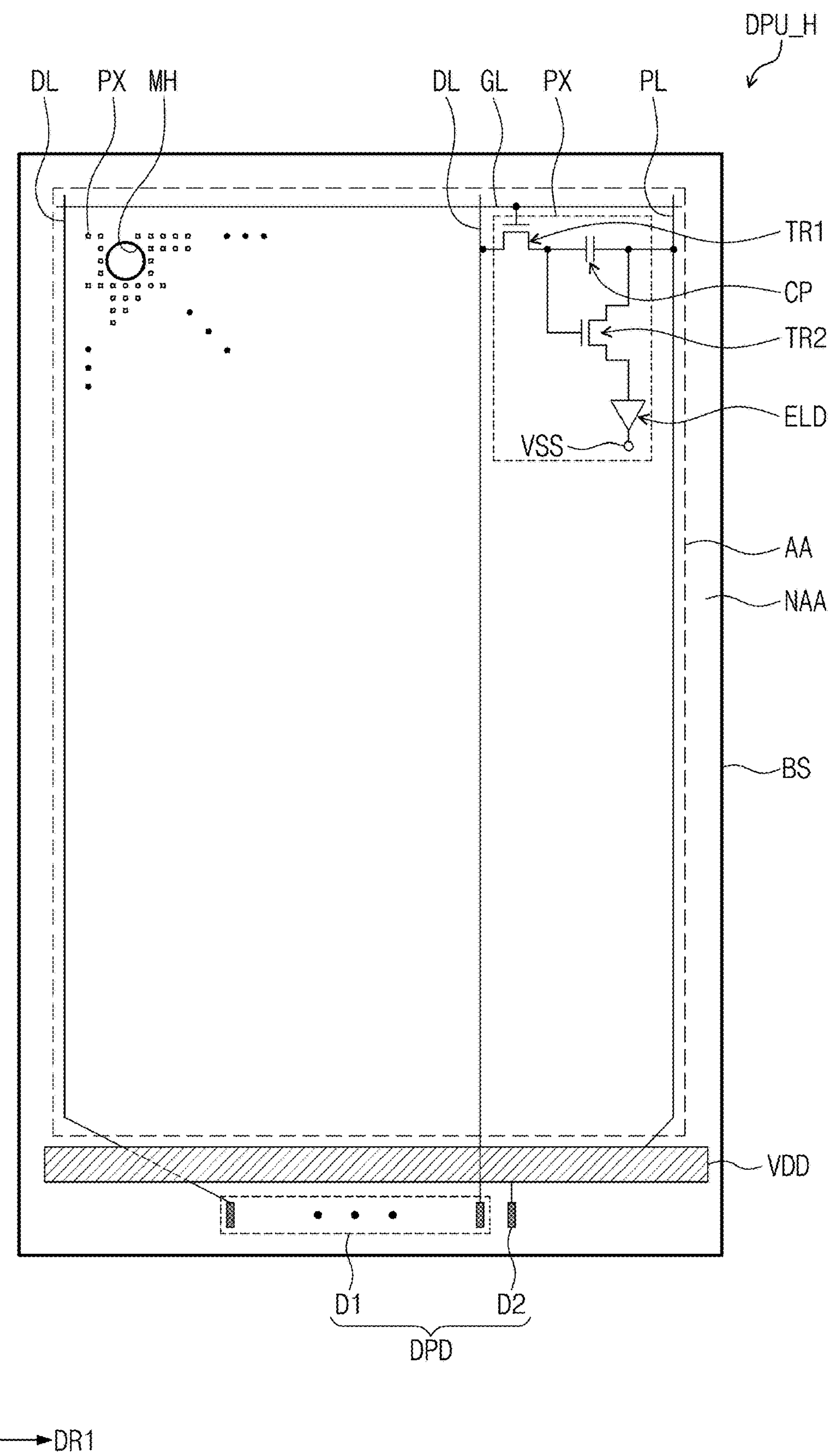
FIGS. 14A, 14B, and 14C are plan views illustrating a portion of constituents of FIG. 13B.
Figure 14B:
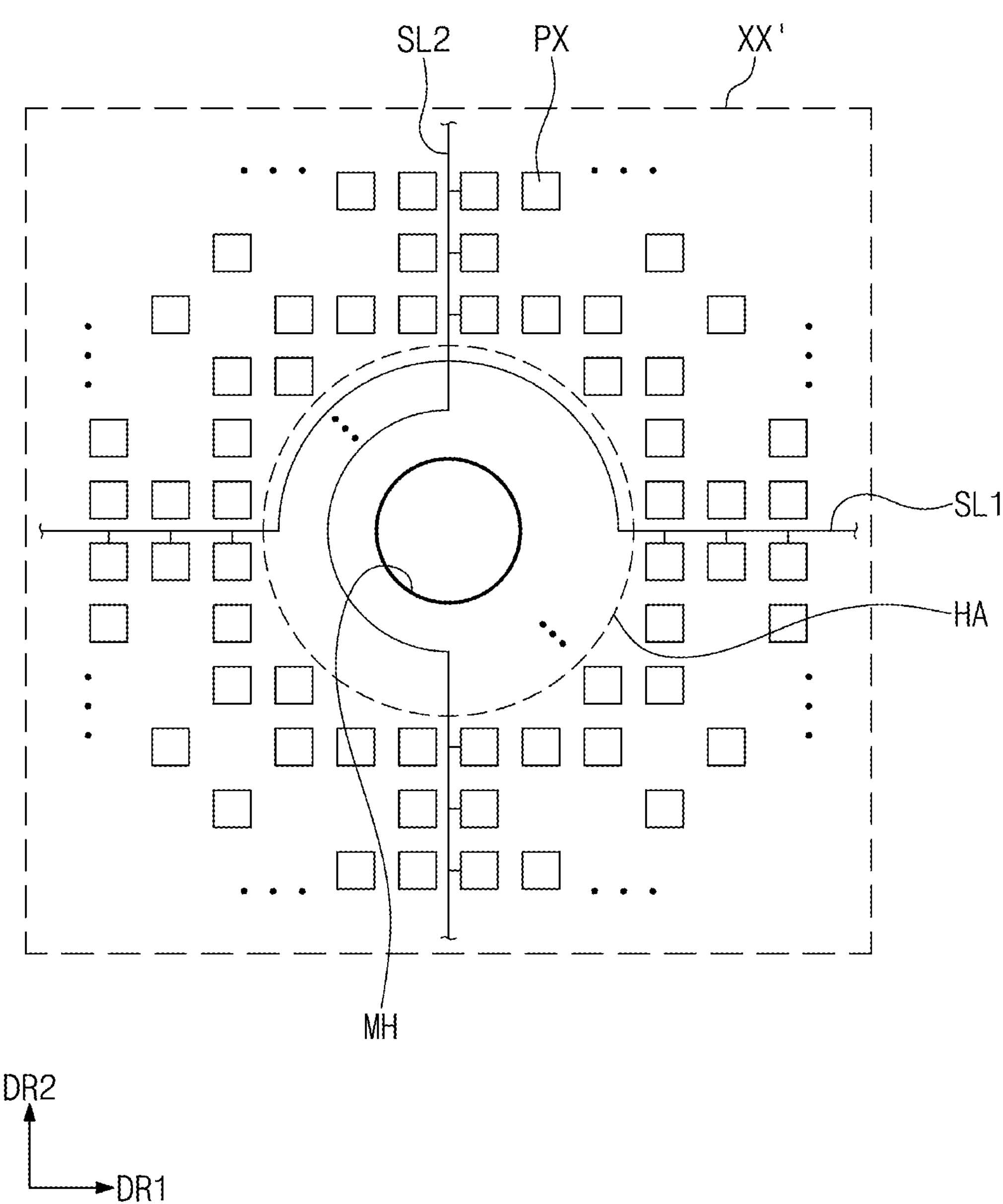
Figure 14C:
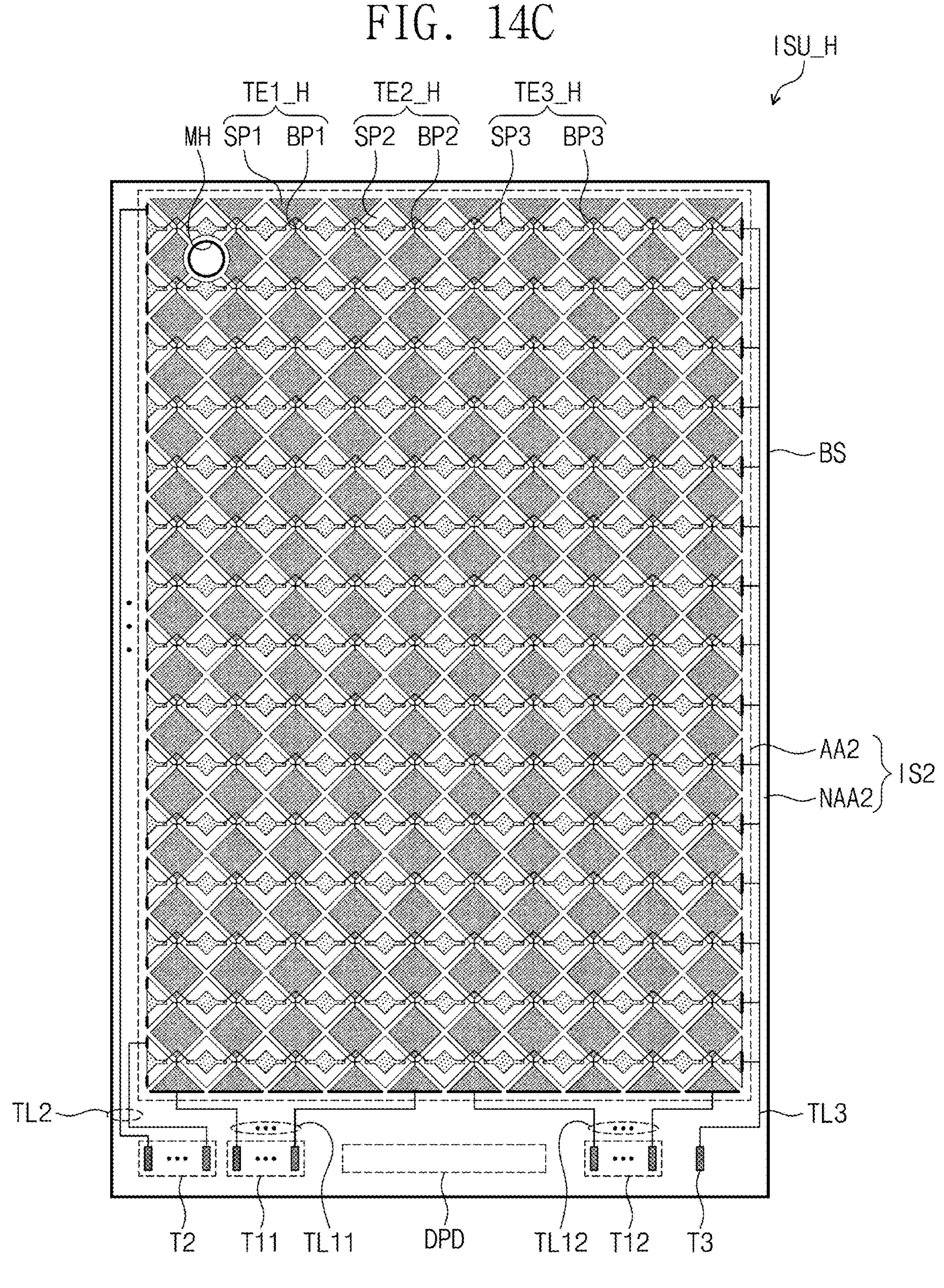

FIG. 13A is a perspective view illustrating a coupled state of the display apparatus according to an exemplary embodiment of the inventive concept. FIG. 13B is an exploded perspective view of the display apparatus of FIG. 13A; FIGS. 14A to 14C are plan views illustrating a portion of constituents of FIG. 13B; FIG. 14A illustrates a plan view of a display unit DPU_H, FIG. 14B illustrates a schematically enlarged view of an area XX', and FIG. 14C illustrates a plan view of the input sensing unit ISU_H. Hereinafter, the inventive concept will be described with reference to FIGS. 13A to 14C. The same reference numeral may be given to components that are the same as those of FIGS. 1 to 12C, and their detailed descriptions will be omitted.

Referring to FIG. 13A, the display apparatus DD may be a device that is activated according to an electrical signal. Examples of the display apparatus DD may include a tablet, a notebook, a computer, a smart television, and the like. In this exemplary embodiment, the display apparatus DD including a smart phone will be described as an example.

The display apparatus DD may display an image IM and sense an external input TC. The image IM includes a still image and a dynamic image. The external input TC includes various types of external inputs, such as a portion of user's body, light, heat, a pressure, or the like. In this embodiment, the user's input TC is illustrated as a user's hand applied to the front surface.

In this exemplary embodiment, the display apparatus DD provides a front surface FS on which an image is displayed, and the external input TC is sensed. However, this is merely an example. For example, as described above, the user's input TC may be provided in various shapes. The display apparatus DD may sense the user's input TC applied to a side surface or the rear surface of the display apparatus DD according to a structure of the display apparatus DD, but the inventive concept is not so limited.

As illustrated in FIG. 13B, the display apparatus DD may include a window panel WP, an electronic panel EP, an electronic module EM, and an external case EDC. The window panel WP may include an insulation material. For example, the window panel WP may be made of glass, plastic, or a combination thereof.

The front surface FS of the display apparatus DD may correspond to a front surface of the window panel WP. The front surface FS of the window panel WP includes a transmission area TA and a bezel area BZA. The transmission area TA may be an optically transparent area. For example, the transmission area TA may be an area having a visible light transmittance of about 90% or more. The transmission area TA may correspond to the above-described transmission area WP-T (see FIG. 2A).

The bezel area BZA may be an area having a lower light transmittance than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover the peripheral area NAA of the electronic panel 200 to prevent the peripheral area NAA from being visible from the outside. In this exemplary embodiment, the bezel area BZA may be defined by the above-described light blocking pattern WP-BZ (see FIG.

2A) and correspond to the peripheral area NAA. However, this is merely an example. For example, in the window panel WP, the bezel area BZA may be omitted.

A predetermined hole area HA may be defined in the window panel WP according to this exemplary embodiment. The hole area HA may be provided within the transmission area TA. The hole area MH overlaps the electronic module EM in a plan view. In this exemplary embodiment, the hole area HA may correspond to an area overlapping a module hole MH of an electronic panel EP_H, which will be described later, of the window panel WP.

The electronic module EM is disposed below the window panel WP. The electronic module EM may overlap the module hole MH in a plan view and also overlap the hole area HA. The electronic module EM may receive an external input transmitted through the hole area HA or provide an output through the hole area HA. At least a portion of the electronic module EM may be accommodated in the module hole MH. According to the inventive concept, the electronic module EM may be disposed to overlap the active area AA, thereby preventing the bezel area BZA from increasing.

The electronic module EM includes various functional modules for driving the display apparatus DD. The electronic module EM may be electrically connected to the electronic panel EP through a connector (not shown). For example, the electronic module EM may be a camera, a speaker, or a sensor that senses light or heat.

The electronic panel EP_H may display an image IM and sense an external input TC. In this exemplary embodiment, the predetermined module hole MH may be defined in the electronic panel EP_H. The module hole MH may be defined by passing through the electronic panel EP_H in the third direction DR3.

In this exemplary embodiment, the module hole MH may be defined within the active area AA. The module hole MH overlaps an electronic module EM that will be described later. The electronic module EM may receive external subject information provided to the outside of the window panel WP through the module hole MH.

Particularly, the electronic panel EP_H will be described with reference to FIGS. 14A to 14C. FIG. 14A illustrates a plan view of a portion of the display unit DPU_H of the electronic panel EP_H, and FIG. 14B illustrates a plan view of an input sensing unit ISU_H of the electronic panel EP_H. FIG. 14B schematically illustrates an area corresponding to an area XX' of the display unit DPU_H.

As illustrated in FIGS. 14A and 14B, the display unit DPU_H includes a plurality of pixels PX. The pixels PX may be disposed around the module hole MH to surround the module hole MH in a plan view. The pixels PX may be respectively connected to a power line PL, a data line DL, and a scan line GL, which are connected to a first power source terminal VDD. Display pads DPF may include pads D1 connected to the data line DL and pads D2 connected to the first power source terminal VDD. FIG. 14A illustrates a second power source terminal VSS connected to a light emitting element ELD. Hereinafter, duplicated detail description with respect to the pixels PX will be omitted.

The display unit DPU_H is penetrated by the module hole MH. In FIG. 14B, two first and second signal lines SL1 and SL2 of the signal lines respectively connected to the pixels PX are illustrated.

The first signal line SL1 extends in the first direction DR1. The first signal line SL1 is connected to the pixels of the pixels PX in the same row arranged in the first direction DR1. The first signal line SL1 may correspond to a scan line GL. The first signal line SL1 may provide a gate signal for turning on the pixels PX to corresponding pixels.

A portion of the pixels PX connected to the first signal line SL1 may be disposed at the left side of the module hole MH, and other portion of the pixels PX may be disposed at the right side of the module hole MH. Thus, the pixels in the same row connected to the first signal line SL1 may be turned on/off by substantially the same gate signal even though a portion of the pixels with respect to the module hole MH is omitted.

The second signal line SL2 extends in the second direction DR2. The second signal line SL2 is connected to the pixels in the same column arranged in the second direction DR2 of the pixels PX. The second signal line SL2 may correspond to, for example, the data line DL. The second signal line SL2 provides a data signal to the corresponding pixels PX.

A portion of the pixels PX connected to the second signal line SL2 may be disposed above the module hole MH, and other portion of the pixels PX may be disposed below the module hole MH. Thus, the pixels in the same column connected to the second signal line SL2 may receive a data signal through the same line even though a portion of the pixels with respect to the module hole MH is omitted.

In the display unit DPU_H according to an exemplary embodiment of the inventive concept, the first signal line SL1 may correspond to the scan line, and the second signal line SL2 may correspond to the data line. Alternatively, the first signal line SL1 and the second signal line SL2 may be one of a power line, an initial voltage line, and an emission control line. Also, although not shown, each of the pixels PX may be further connected to additional signal lines (not shown).

Referring to FIG. 14C, the input sensing unit ISU_U is penetrated by the module hole MH. At least a portion of first electrodes TE1_U, second electrodes TE2_U, and third electrodes TE3_U disposed on a sensing area AA2 may be disposed adjacent to an edge of the module hole MH to surround the module hole MH. The first electrodes TE1_U, the second electrodes TE2_U, and the third electrodes TE3_U, which are adjacent to the module hole MH, may include first main patterns SP1_H, second main patterns SP2_H, and third main patterns SP3_H, each of which has a partially-removed shape when compared to that of each of the patterns spaced apart from the module hole MH.

Referring again to FIG. 13B, the external case EDC is disposed below the window panel WP. The external case EDC may be coupled to the window panel WP to define an outer appearance of the display apparatus DD_H. The external case EDC may include a material having relatively high rigidity. For example, the external case EDC may include a plurality of frames and/or plates, which are made of glass, plastic, and a metal. The external case EDC provides a predetermined accommodation space. The electronic panel EP_H and the electronic module EM may be accommodated in the accommodation space and thus be protected from an external impact.

According to the inventive concept, the electronic module EM may be disposed so that a portion of the electronic module overlaps the active area AA of the electronic panel EP_H and the transmission area TA of the window panel WP. Thus, the bezel area may be reduced in surface area to improve a sense of beauty of the display apparatus DD.

Figure 15A:
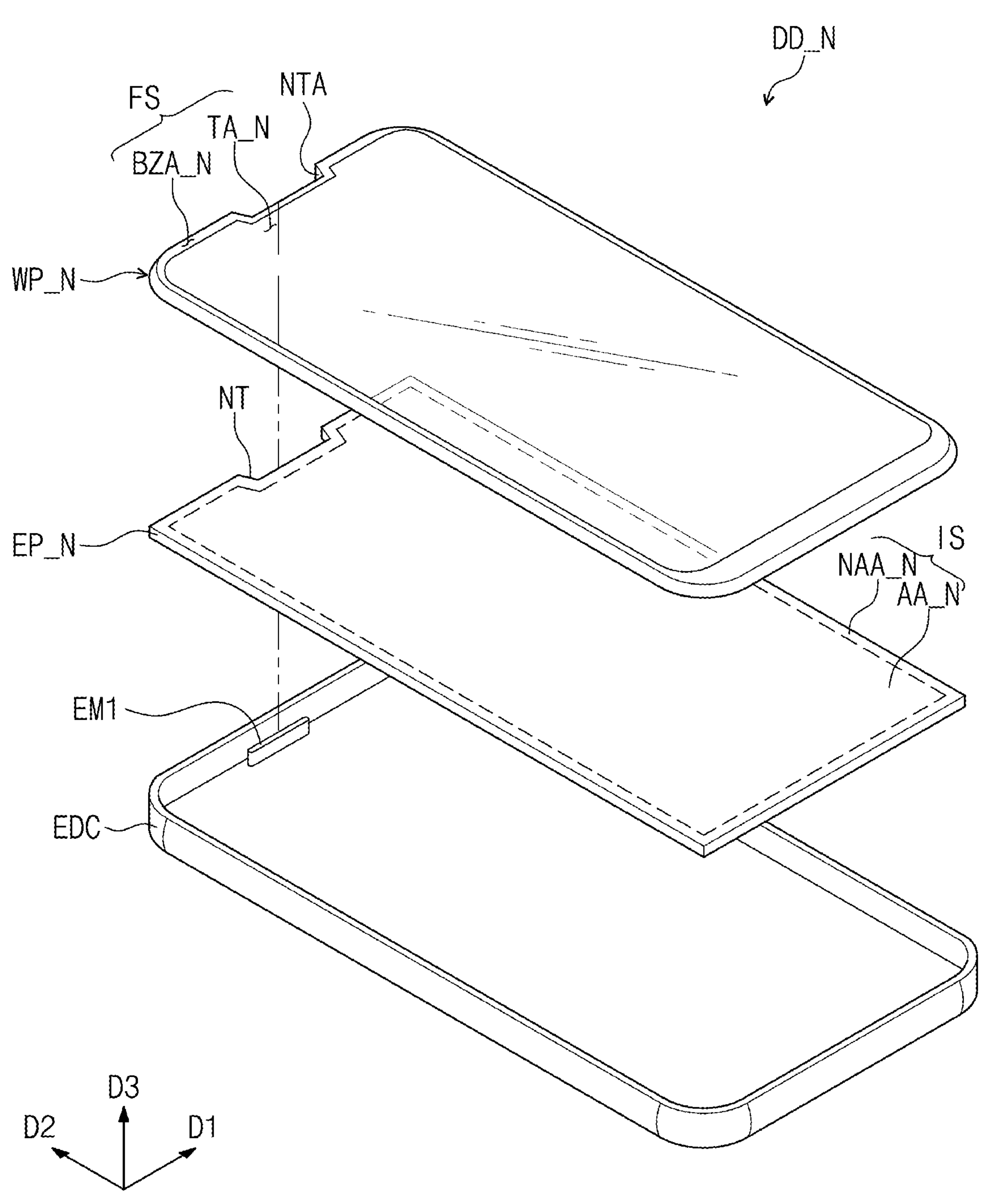
FIG. 15A is an exploded perspective view of a display apparatus according to an exemplary embodiment of the inventive concept.
Figure 15B:
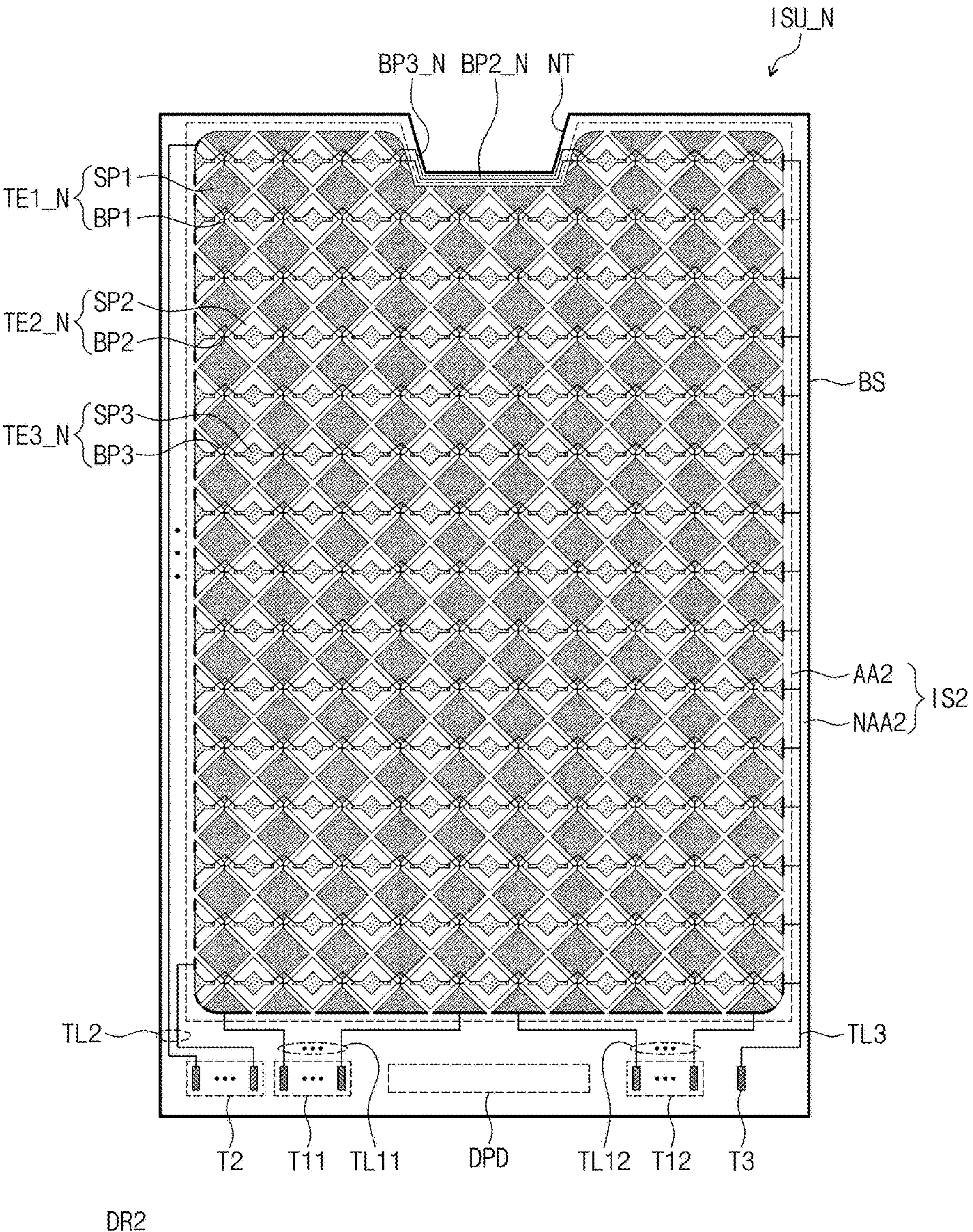
FIG. 15B is a plan view illustrating a portion of constituents of FIG. 15A.

FIG. 15A is an exploded perspective view of a display apparatus according to an exemplary embodiment of the inventive concept, FIG. 15B is a plan view illustrating a portion of constituents of FIG. 15A. Hereinafter, the inventive concept will be described with reference to FIGS. 15A and 15B. The same reference numeral may be given to components that are the same as those of FIGS. 1 to 7B, and their detailed descriptions will be omitted.

A display apparatus DD_N may include a window panel WP_N, an electronic panel EP_N, an electronic module EM1, and an external case EDC. The window panel WP_N may further include a notch part NTA defined on one side thereof when compared to the window panel WP_H (see FIG. 13B) of FIG. 13B.

The notch part NTA may be formed by recessing a portion of an extending side of the window panel WP_N toward a center of the window panel WP_N. Thus, a front surface FS of the window panel WP_N may include a transmission part TA_N and a bezel area BZA_N, each of which has a shape deformed by the notch part NTA. Each of the transmission area TA_N and the bezel area BZA_N may have a shape having a recessed one side to correspond to the notch part NTA.

The notch part NTA may be defined in an area of the window panel WP_N overlapping the electronic module EM1. The electronic module EM1 may be a camera, a speaker, or a sensor that senses light or heat. According to the inventive concept, the electronic module EM1 may be exposed to the outside through the notch part NTA of the window panel WP_N.

The electronic panel EP_N is disposed between the window panel WP_N and the external case EDC. The notch part NT may be provided in the electronic panel EP_N to correspond to the window panel WP_N. The notch part NT of the electronic panel EP_N may be defined in a position overlapping the electronic module EM1. According to the inventive concept, the electronic module EM1 may be exposed from the electronic panel EP_N and the window panel WP_N to easily provide an outputted signal to the outside or easily receive external information without interfering with the window panel WP_N or the electronic panel EP_N.

Referring to FIG. 15B, an input sensing unit ISU_N may include a predetermined notch part NT. In this exemplary embodiment, the notch part NT may be defined by recessing a portion of an upper side of the display unit DPU_N, which extends in the first direction DR1, in an opposite direction of the second direction DR2.

As the notch part NT is defined, at least a portion of first electrode TE1_N, second electrode TE2_N, and third electrode TE3_N, which are disposed on a sensing area AA2, may have a partially removed shape when compared to the input sensing unit ISU (see FIG. 6B) of FIG. 6B. For example, a portion of the first electrodes TE1_N may have a surface area or length less than that of an area spaced apart from the notch part NT due to the notch part NT. The first electrode of the first electrodes TE1_N, which is spaced apart from the notch part NT in the second direction DR2, may have a length and surface area less than those of the first electrode spaced apart from the notch part NT in the first direction DR1.

Also, for example, a portion of the second electrodes TE2_N may be divided into left and right portions with respect to the notch part NT. The second connection pattern BP2_N connecting two second main patterns SP2_N of the second electrode TE2_N, which are spaced apart from each other with respect to the notch part NT, to each other may extend along an edge of the notch part NT. Thus, a portion of the second electrode TE2_N may be electrically connected through the second connection pattern BP2_N even though the second electrodes TE2_N are separated by the notch part NT.

Also, for example, a portion of the third electrodes TE3_N may be divided into left and right portions with respect to the notch part NT, like the second electrodes TE2_N. Thus, the third connection pattern BP3_N adjacent to the notch part NT may extend along an edge of the notch part NT to connect the two third main patterns SP3_N, which are spaced apart from each other with the notch part NT therebetween in the first direction DR1, to each other. Thus, a portion of the third electrode TE3_N may be electrically connected through the third connection pattern BP3_N even though the second electrodes TE2_N are separated by the notch part NT.

According to the inventive concept, the input sensing unit ISU_N having the various shapes and the display apparatus DD_N including the input sensing unit ISU_N may be provided. Also, in the various shapes of the input sensing unit ISU_N, the third connection pattern BP3_M may be designed so that the third connection pattern BP3_M does not overlap the first connection patterns BP1_N. Therefore, the electronic device, in which the overlapping between the third connection patterns BP3_N and the first connection patterns BP1_N in a plan view is prevented to improve electrical reliability, may be provided.

According to the inventive concept, the overlapping between the signal lines that transmit the electrical signals different from each other may be reduced. Thus, the occurrence of noise due to the electrical interference between the signal lines may be reduced to improve the input sensing unit having the improved external input sensitivity. In addition, the display apparatus having the improved electrical reliability may be provided.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:

a display unit including pixels and an encapsulation layer covering the pixels and including a first inorganic layer, a second inorganic layer, and an organic layer disposed between the first and second inorganic layers; and an input sensing unit having a sensing area and a peripheral area, the input sensing unit including:

at least one sensing insulating layer disposed on the encapsulation layer; and first to third electrodes insulated from each other, wherein the display unit and the input sensing unit include a notch portion in which one area is recessed, wherein:

each of the first electrodes includes first main patterns in the sensing area and not in the peripheral area, each of the second electrodes includes second main patterns in the sensing area and not in the peripheral area, each having an opening and insulated from the first main patterns and arranged in a first direction, each of the third electrodes includes third main patterns disposed inside the openings, and one of the third electrodes includes:

third separated main patterns separated by the notch portion among the third main patterns and spaced apart along the first direction with the notch portion interposed therebetween and a third extended connection pattern connecting the third separated main patterns; and the third extended connection pattern extends along an edge of the notch portion in the peripheral area.

2. The display apparatus of claim 1, wherein a shape of the third separated main pattern is different from a shape of the third main pattern.

3. The display apparatus of claim 1, wherein one of the second electrodes includes second separated main patterns separated by the notch portion among the second main patterns and spaced apart along the first direction with the notch portion interposed therebetween and each having a cutting opening which is disposed of the third separated main pattern and a second cutting extended connection pattern connecting the second separated main patterns, and wherein the second extended connection pattern extends along the edge of the notch portion in the peripheral area.

4. The display apparatus of claim 3, wherein the third extended connection pattern and the second extended connection pattern do not overlap.

5. The display apparatus of claim 1, wherein:

each of the first electrodes includes first connection patterns connecting first main patterns spaced apart along a second direction intersecting the first direction, each of the second electrodes includes second connection patterns connecting second main patterns spaced apart along the first direction, and each of the third electrodes includes third connection patterns connecting third main patterns spaced apart along the first direction.

6. The display apparatus of claim 5, wherein the first connection pattern and the second connection pattern overlap, and the third connection pattern is non-overlapping with the first connection pattern and the second connection pattern.

7. The display apparatus of claim 5, wherein at least a portion of the third connection pattern overlaps one of the second main patterns and the first main patterns on a plane.

8. The display apparatus of claim 5, wherein the at least one sensing insulating layer includes a first sensing insulating layer disposed on the second inorganic layer, a second sensing insulating layer disposed on the first sensing insulating layer, and a third sensing insulating layer disposed on the second sensing insulating layer.

9. The display apparatus of claim 8, wherein the first connection patterns and the third connection patterns are disposed on the first sensing insulating layer and covered by the second sensing insulating layer.

10. The display apparatus of claim 9, wherein the first connection pattern is connected to the first main patterns through a first contact hole defined in the first sensing insulating layer, and wherein the third connection pattern is connected to the third main patterns through a second contact hole defined in the first sensing insulating layer.

11. The display apparatus of claim 8, wherein the first main patterns, the second main patterns, the third main patterns, the third separated main patterns, and the third extended connection pattern are disposed on the second sensing insulating layer and covered by the third sensing insulating layer.

12. The display apparatus of claim 8, wherein the first sensing insulating layer is disposed directly on the second inorganic layer.

13. The display apparatus of claim 1, wherein each of the third main patterns includes a first portion having a rhombus shape and second portions protruding from the first portion along the first direction with the first portion interposed therebetween.

14. The display apparatus of claim 1, wherein each of the second electrodes includes second connection patterns connecting second main patterns spaced apart along the first direction, and wherein each of the first main patterns, the second main patterns, the second connection patterns, and the third main patterns includes mesh lines extending in a direction crossing each other.

15. The display apparatus of claim 1, wherein the third electrode is provided with a ground voltage.

16. An electronic apparatus comprising:

a display unit displays an image based on input image data provided from a processor and the display unit including pixels providing the image and an encapsulation layer covering the pixels and including a first inorganic layer, a second inorganic layer, and an organic layer disposed between the first and second inorganic layers;

a driving unit drives the display unit based on the input image data and a brightness value of the display unit; and an input sensing unit having a sensing area and a peripheral area, the input sensing unit including:

at least one sensing insulating layer disposed on the encapsulation layer; and first to third electrodes insulated from each other, wherein the display unit and the input sensing unit include a notch portion in which one area is recessed, wherein:

each of the first electrodes includes first main patterns in the sensing area and not in the peripheral area, each of the second electrodes includes second main patterns in the sensing area and not in the peripheral area, each having an opening and insulated from the first main patterns and arranged in a first direction, each of the third electrodes includes third main patterns disposed inside the openings, and one of the third electrodes includes:

third separated main patterns separated by the notch portion among the third main patterns and spaced apart along the first direction with the notch portion interposed therebetween and a third extended connection pattern connecting the third separated main patterns; and the third extended connection pattern extends along an edge of the notch portion in the peripheral area.

17. The electronic apparatus of claim 16, wherein a shape of the third separated main pattern is different from a shape of the third main pattern.

18. The electronic apparatus of claim 16, wherein one of the second electrodes includes second separated main patterns separated by the notch portion among the second main patterns and spaced apart along the first direction with the notch portion interposed therebetween and each having a cutting opening which is disposed of the third separated main pattern and a second extended connection pattern connecting the second separated main patterns, wherein the second extended connection pattern extends along the edge of the notch portion, and wherein the third extended connection pattern and the second extended connection pattern do not overlap.

19. The electronic apparatus of claim 16, wherein:

each of the first electrodes includes first connection patterns connecting first main patterns spaced apart along a second direction intersecting the first direction, each of the second electrodes includes second connection patterns connecting second main patterns spaced apart along the first direction, each of the third electrodes includes third connection patterns connecting third main patterns spaced apart along the first direction, and the first connection pattern and the second connection pattern overlap, and the third connection pattern is non-overlapping with the first connection pattern and the second connection pattern.

20. The electronic apparatus of claim 19, wherein at least a portion of the third connection pattern overlaps one of the second main patterns and the first main patterns on a plane.

* * * * *